United States Patent
Kim et al.

(10) Patent No.: US 11,644,421 B2
(45) Date of Patent: May 9, 2023

(54) DOWN-CONVERTED LIGHT EMITTING COMBINATION AND METHOD OF MANUFACTURING THE SAME

(71) Applicant: Korea University Research and Business Foundation, Seoul (KR)

(72) Inventors: Woong Kim, Seoul (KR); Sungnam Park, Seoul (KR); Wonbae Sohn, Seoul (KR); Gangyeol Yoo, Seoul (KR); Chiho Lee, Anyang-si (KR)

(73) Assignee: Korea University Research and Business Foundation, Seoul (KR)

( * ) Notice: Subject to any disclaimer, the term of this patent is extended or adjusted under 35 U.S.C. 154(b) by 366 days.

(21) Appl. No.: 16/998,103

(22) Filed: Aug. 20, 2020

(65) Prior Publication Data
US 2021/0055219 A1 Feb. 25, 2021

(30) Foreign Application Priority Data
Aug. 20, 2019 (KR) ........................ 10-2019-0101440

(51) Int. Cl.
*H01L 33/50* (2010.01)
*G01N 21/64* (2006.01)
(Continued)

(52) U.S. Cl.
CPC ........... *G01N 21/64* (2013.01); *C01F 17/218* (2020.01); *C01G 31/006* (2013.01); *C09D 5/22* (2013.01);
(Continued)

(58) Field of Classification Search
CPC .............................. C01F 17/218; H01L 33/504
(Continued)

(56) References Cited

U.S. PATENT DOCUMENTS 7,476,411 B1 * 1/2009 Hampden-Smith ..... C01B 17/20
427/256
10,062,673 B2 * 8/2018 Schmidt ............... C09K 11/886
(Continued)

FOREIGN PATENT DOCUMENTS

JP 2000-31532 A 1/2000
JP 2017-510843 A 4/2017
(Continued)

OTHER PUBLICATIONS

Xu, Zhenhe, et al. "Ln3+ (Ln=Eu, Dy, Sm, and Er) ion-doped YVO4 nano/microcrystals with multiform morphologies: hydrothermal synthesis, growing mechanism, and luminescent properties," *Inorganic chemistry*, 49, 14, 2010 (pp. 6706-6715).
(Continued)

*Primary Examiner* — Christopher M Raabe
(74) *Attorney, Agent, or Firm* — NSIP Law

(57) ABSTRACT

A down-converted light emitting combination that generates a visible light when an ultraviolet light is incident is provided. The down-converted light emitting combination includes a first structure made of a first material that generates a visible light of a first color when an ultraviolet light of a first wavelength range is incident and a second structure made of a second material that generates a visible light of a second color different from the first color when the ultraviolet light of a second wavelength range different from the first wavelength range is incident, and the first material and the second material have different emission colors and distributions of intensities of the visible lights generated depending on a wavelength of the incident ultraviolet light.

20 Claims, 35 Drawing Sheets

(51) Int. Cl.
  *C09K 11/77* (2006.01)
  *C01F 17/218* (2020.01)
  *C09D 5/22* (2006.01)
  *C01G 31/00* (2006.01)
  *H01L 33/00* (2010.01)
  *F21V 8/00* (2006.01)

(52) U.S. Cl.
  CPC ...... *C09K 11/7787* (2013.01); *C09K 11/7794* (2013.01); *G02B 6/0065* (2013.01); *H01L 33/005* (2013.01); *C01P 2002/54* (2013.01)

(58) Field of Classification Search
  USPC ....................................................... 250/461.1
  See application file for complete search history.

(56) References Cited

U.S. PATENT DOCUMENTS

| | | |
|---|---|---|
| 2006/0221021 A1 | 10/2006 | Hajjar et al. |
| 2007/0014318 A1 | 1/2007 | Hajjar et al. |
| 2009/0147537 A1 | 6/2009 | Iwasaki |
| 2011/0062430 A1 | 3/2011 | van Veggel et al. |
| 2011/0162711 A1 | 7/2011 | Takeuchi et al. |
| 2013/0302358 A1* | 11/2013 | Collins .............. C09K 11/7773 530/391.1 |
| 2019/0002761 A1 | 1/2019 | Moon et al. |
| 2021/0238477 A1* | 8/2021 | Butendeich ........ C09K 11/0883 |

FOREIGN PATENT DOCUMENTS

| | | |
|---|---|---|
| KR | 10-1120940 B1 | 3/2012 |
| KR | 10-1121717 B1 | 3/2012 |
| KR | 10-2013-0015847 A | 2/2013 |
| KR | 10-2014-0027184 A | 3/2014 |
| KR | 10-1466610 B1 | 12/2014 |
| KR | 10-1543625 B1 | 8/2015 |
| KR | 10-1659237 B1 | 9/2016 |
| KR | 10-1792800 B1 | 11/2017 |
| KR | 10-2018-0051606 A | 5/2018 |
| KR | 10-1963960 B1 | 3/2019 |
| WO | WO 2007/119230 A1 | 10/2007 |
| WO | WO 2008/041660 A1 | 4/2008 |
| WO | WO 2009/077209 A2 | 6/2009 |

OTHER PUBLICATIONS

Sohn et al., "Visualization of UV by Nanopatterned Down-Shifting Materials Mimicking Human Retinal Cone Cells," Advanced Functional Materials, 2020, vol. 30, 11 pages.

Chang, Menglei, et al. "Core-shell-core heterostructural engineering of Y2O3: Eu3+/MCM-41/YVO4: Eu3+ for enhanced red emission and tunable, broadened-band response to excitation." Journal of Materials Science: Materials in Electronics 28.21 (2017): 16026-16035.

* cited by examiner

DOWN-CONVERTED LIGHT EMITTING COMBINATION AND METHOD OF MANUFACTURING THE SAME

CROSS-REFERENCE TO RELATED APPLICATIONS

A claim for priority under 35 U.S.C. § 119 is made to Korean Patent Application No. 10-2019-0101440 filed on Aug. 20, 2019, in the Korean Intellectual Property Office, the entire contents of which are hereby incorporated by reference.

BACKGROUND

Embodiments of the inventive concept described herein relate to a combination of nanopatterns of down-converted light emitting materials that generates a visible light when an ultraviolet light is incident and a method of manufacturing the same. The inventive concept is derived from studies conducted as a part of a (original) future promising convergence technology pioneer project (Project number: 2013M3C1A3065042, Management agency: Korea University Industry-Academic Cooperation Foundation, Project Name: Synthesis of highly efficient wavelength converting nanomaterials and their application for spectrum control platform, Research period: Sep. 18, 2013~Feb. 28, 2019).

A conventional method of manufacturing a down-converted light emitting thin film, that down-converts an ultraviolet light into a visible light when the ultraviolet light is incident, has manufactured a down-converted light emitting thin film with a micro-pattern thin film that is larger than a nano-size. There are research results on the down-converted light emitting thin film using a nanostructure of a halide perovskite material but, in these cases, it suffers from inherent material instability and broad absorption spectrum.

A conventional technology for detecting an ultraviolet light mainly uses an electrical signal through a photoelectric effect. Also, in a UV-Vis conversion technology, a monochromatic visible light is emitted regardless of incident UV wavelength. Therefore it is not easy to distinguish wavelengths of the ultraviolet lights when applied to a CCD camera and photographed.

SUMMARY

Embodiments of the inventive concept provide a down-converted light emitting combination having improved luminescence intensity, luminescence efficiency, luminescence quality and application range, and a method of manufacturing the same.

Embodiments of the inventive concept provide a down-converted light emitting combination capable of generating visible lights of different colors depending on a wavelength of an incident ultraviolet light and a method of manufacturing the same.

The problem to be solved by the inventive concept is not limited to this, and other problems not mentioned will be clearly understood by those skilled in the art from the following description.

According to an exemplary embodiment, a down-converted light emitting combination includes a first structure made of a first material that generates a visible light of a first color when an ultraviolet light of a first wavelength range is incident and a second structure made of a second material that generates a visible light of a second color different from the first color when an ultraviolet light of a second wavelength range is incident, and the first material and the second material are materials which generate visible lights of different wavelength ranges and different distributions of intensities depending on a wavelength of the incident ultraviolet light.

The down-converted light emitting combination may further include a substrate for supporting the first structure and the second structure and the first structure and the second structure may be formed in a nano-pattern on the substrate, respectively.

The first material and the second material may be provided with yttrium vanadium oxide ($YVO_4$) or yttrium oxide ($Y_2O_3$) in which lanthanide ions are doped to have down-converted light emission characteristics that generates the visible light when the ultraviolet light is incident.

The lanthanide ions may be provided with europium ion ($Eu^{3+}$), bismuth ion ($Bi^{3+}$), or erbium ion ($Er^{3+}$).

The down-converted light emitting combination may further include a third structure made of a third material that generates a visible light of a third color different from the first color and the second color when an ultraviolet light of a third wavelength range is incident, and the first material, the second material, and the third material are materials which generate visible lights of different wavelength ranges and different distributions of intensities depending on a wavelength of an incident ultraviolet light.

The down-converted light emitting combination may further include a substrate for supporting the first structure, the second structure, and the third structure and the first structure, the second structure, and the third structure may be formed in a nano-pattern on the substrate, respectively.

The first material, the second material, and the third material may be provided with yttrium vanadium oxide ($YVO_4$) or yttrium oxide ($Y_2O_3$) in which lanthanide ions are doped to have down-converted light emission characteristics that generates the visible light when the ultraviolet light is incident.

The first color, the second color, and the third color may be one of red, green, and blue colors, respectively.

A range of the color of the visible light generated may be controllable by adjusting a size of the nano-pattern of each structure.

According to an exemplary embodiment, method of manufacturing a down-converted light emitting combination that generates a visible light when an ultraviolet light is incident includes forming a first structure made of a first material that generates a visible light of a first color when an ultraviolet light of a first wavelength is incident on a substrate and forming a second structure made of a second material that generates a visible light of a second color different from the first color when the ultraviolet light of a second wavelength different from the first wavelength is incident on the substrate on which the first structure is formed.

The forming of the first structure may include first coating a first solution in which components constituting the first material are dissolved on the substrate, seating a first PDMS mold on the substrate to which the first solution is applied, and evaporating a first solvent of the first solution applied on the substrate.

The forming of the first structure may further include removing the first PDMS mold from the substrate after the evaporating of the first solvent and first heating the substrate.

The method may further include preparing the first solution and in the preparing of the first solution, $Y(NO_3)_3 \cdot 6H_2O$ and citric acid and $Eu(NO_3)_3 \cdot 6H_2O$, $Bi(NO_3)_3 \cdot 4H_2O$ or Er(NO$_3$)$_3$.5H$_2$O may be mixed with a 2-methoxyethanol solvent to prepare the first solution.

In the preparing of the first solution, VO(acac)$_2$ may be further mixed with the 2-methoxyethanol solvent to prepare the first solution.

The forming of the second structure may include second coating a second solution in which components constituting the second material are dissolved on the substrate on which the first structure is formed, seating a second PDMS mold on the substrate to which the second solution is applied, and evaporating a second solvent of the second solution applied on the substrate.

The forming of the second structure may further include removing the second PDMS mold from the substrate after the evaporating of the second solvent and second heating the substrate.

The method may further include preparing the second solution and in the preparing of the second solution, Y (NO$_3$)$_3$.6H$_2$O and citric acid and, Eu(NO$_3$)$_3$.6H$_2$O, Bi (NO$_3$)$_3$.4H$_2$O, or Er(NO$_3$)$_3$.5H$_2$O may be mixed to a 2-methoxyethanol solvent to prepare the second solution.

In the preparing of the second solution, VO(acac)$_2$ may be further mixed in the 2-methoxyethano to prepare the second solution.

In in the seating the second PDMS mold, the PDMS mold may be rotated at a predetermined angle with respect to the PDMS mold seated in the seating of the first PDMS mold to be seated on the substrate coated with the second solution.

The method may further include forming a third structure formed on the substrate on which the first structure and the second structure are formed, and made of a third material that generates a visible light of a third color different from the first color and the second color when the ultraviolet light of a third wavelength different from the first and the second wavelength is incident.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
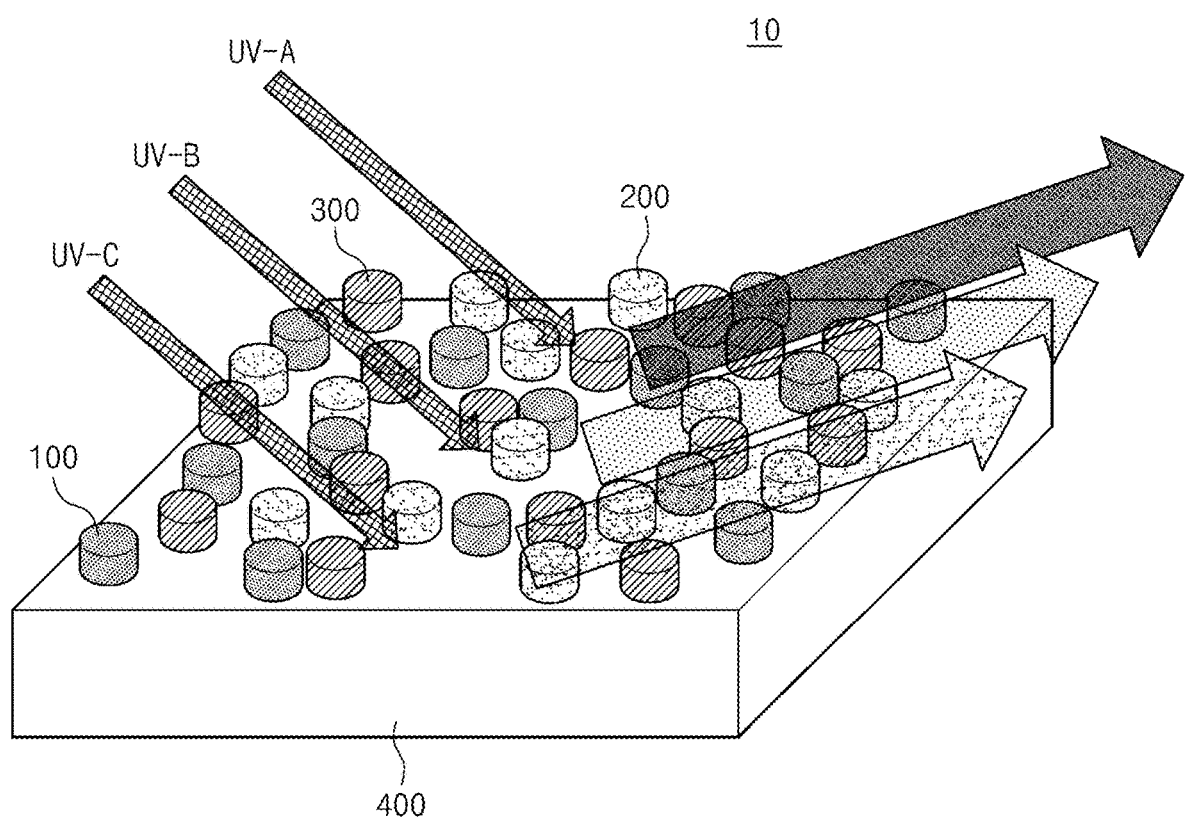
FIG. 1 is a perspective view schematically illustrating a down-converted light emitting combination according to an embodiment of the inventive concept.

Hereinafter, embodiments of the inventive concept will be described in more detail with reference to the accompanying drawings. The embodiments of the inventive concept may be modified in various forms, and the scope of the inventive concept should not be interpreted as being limited to the following embodiments. This embodiment is provided to more fully describe the inventive concept to those skilled in the art. Therefore, the shape of the elements in the drawings has been exaggerated to emphasize a clearer explanation.

FIG. 1 is a perspective view schematically illustrating a down-converted light emitting combination according to an embodiment of the inventive concept. Referring to FIG. 1, a down-converted light emitting combination 10 generates a visible light when an ultraviolet light is incident. The down-converted light emitting combination 10 generates the visible light of different colors depending on a wavelength of the incident ultraviolet light. According to an embodiment, the down-converted light emitting combination 10 includes a first structure 100, a second structure 200, a third structure 300, and a substrate 400.

The first structure 100 is made of a first material. The first material is a material that generates a visible light of a first color when the ultraviolet of a first wavelength light is incident.

The second structure 200 is made of a second material. The second material is a material that generates a visible light of a second color when the ultraviolet light of a second wavelength different from the first wavelength is incident. The second color is a different color from the first color.

The third structure 300 is made of a third material. The third material is a material that generates a visible light of a third color when the ultraviolet light of a third wavelength different from the first wavelength and second wavelength is incident. The third color is a color different from the first color and the second color. According to an embodiment, the first color, the second color, and the third color may be one of red, green, and blue colors, respectively.

According to an embodiment, the first material, the second material, and the third material are provided with yttrium vanadium oxide ($YVO_4$) or yttrium oxide ($Y_2O_3$), which is doped with lanthanide ions, respectively, to have down-converted luminescence characteristics that generate the visible light when the ultraviolet light is incident thereon. The first material, the second material, and the third material have different distributions of intensities of the visible lights generated depending on the wavelength of the incident ultraviolet light. According to an embodiment, the lanthanide ions may be provided with europium ion ($Eu^{3+}$), bismuth ion ($Bi^{3+}$), or erbium ion ($Er^{3+}$). According to an embodiment, the first material may be provided with yttrium oxide doped with europium ion ($Y_2O_3:Eu^{3+}$) or yttrium vanadium oxide doped with europium ion ($YVO_4:Eu^{3+}$). The second material may be provided with yttrium vanadium oxide doped with erbium ion ($YVO_4:Er^{3+}$) or yttrium vanadium oxide doped with bismuth ion ($YVO_4:Bi^{3+}$). The third material may be provided with yttrium oxide doped with bismuth ion ($Y_2O_3:Bi^{3+}$).

The substrate 400 supports the first structure 100, the second structure 200, and the third structure 300. The first structure 100, the second structure 200, and the third structure 300 are formed in a nano pattern on the substrate 400, respectively. According to an embodiment, the substrate 400 may be provided with a silicon oxide ($SiO_2$)/silicon (Si) or quartz material.

Accordingly, when the ultraviolet light is incident, the first structure 100, the second structure 200, and the third structure 300 generate the visible lights of the different colors, respectively, which have different intensities depending on the wavelength of the incident ultraviolet light. The visible lights may be generated at the different intensities depending on the wavelength of the incident ultraviolet light, and therefore the down-converted light emitting combination 10 of the inventive concept may determine the wavelength of the ultraviolet light incident through the color of the visible light generated.

Optionally, the third structure 300 may not be provided. In this case, the first color and the second color are provided with one of red, green, and blue colors and are different from each other. In addition, unlike the above-described embodiment, the first structure 100 and the second structure 200 may be provided with one material of yttrium oxide doped with europium ion ($Y_2O_3:Eu^{3+}$), yttrium vanadium oxide doped with europium ion ($YVO_4:Eu^{3+}$), yttrium vanadium oxide doped with erbium ion ($YVO_4:Er^{3+}$), yttrium vanadium oxide doped with bismuth ion ($YVO_4:Bi^{3+}$), and yttrium oxide doped with bismuth ion ($Y_2O_3:Bi^{3+}$) to have different colors. Even when the third structure 300 is not provided, the wavelength of the ultraviolet light may be determined by a combination of two colors having different intensities depending on the wavelength of the incident ultraviolet light. However, in a case where the third structure 300 is provided, range and precision of the ascertainable ultraviolet wavelength may be excellent compared to a case where the third structure 300 is not provided.

Hereinafter, a method of manufacturing the down-converted light emitting combination 10 according to the above-described embodiment of the inventive concept will be described.

Figure 2:
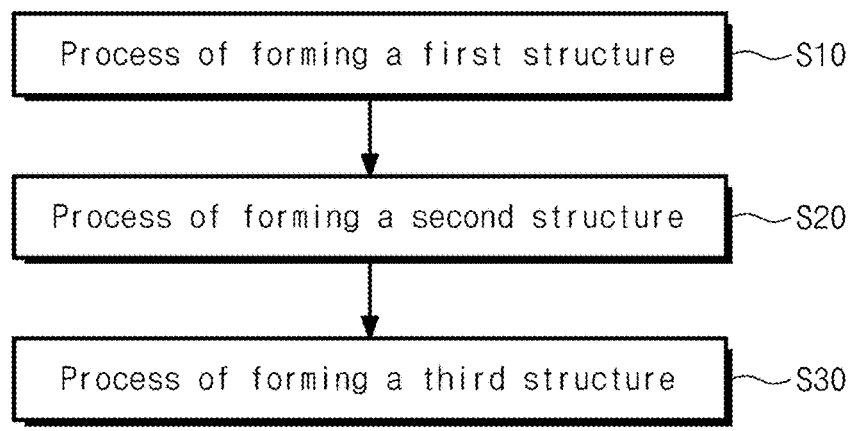
FIG. 2 is a flowchart illustrating a method of manufacturing a down-converted light emitting combination according to an embodiment of the inventive concept.

FIG. 2 is a flowchart illustrating a method of manufacturing a down-converted light emitting combination according to an embodiment of the inventive concept. Referring to FIGS. 1 and 2, the method for manufacturing the down-converted light emitting combination includes forming the first structure in S10, forming the second structure in S20, and forming the third structure in S30. The forming of the first structure in S10, the forming of the second structure in S20, and the forming of the third structure in S30 are sequentially performed with one another.

Figure 3:
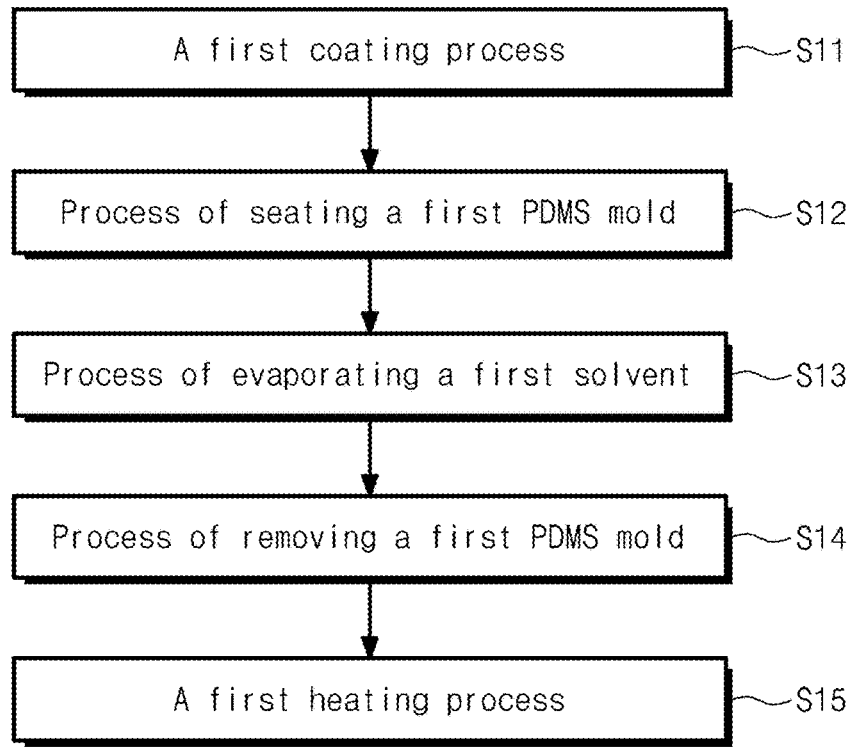
FIG. 3 is a flowchart illustrating a forming of a first structure of FIG. 2.

FIG. 3 is a flowchart illustrating the forming of the first structure in S10 of FIG. 2. Referring to FIGS. 1 and 3, in the forming of the first structure in S10, the first structure 100 is formed on the substrate 400. According to an embodiment, the forming of the first structure in S10 includes first coating in S11, seating a first polydimethyl siloxane (PDMS) mold in S12, evaporating a first solvent in S13, removing the first PDMS in S14, and a first heating in S15.

In the first coating in S11, a first solution is applied on the substrate 400. The first solution is a solution in which components constituting the first material are dissolved.

The seating of the first PDMS mold in S12 is performed after the first coating in S11. In seating of the first PDMS mold in S12, the PDMS mold is seated on the substrate 400 to which the first solution is applied in the first coating in S11. According to an embodiment, the PDMS mold has a height of 1.2 μm, a diameter of 650 nm, and a spacing of 1.0 μm without the third structure or a spacing of 2.0 μm with the third structure, and is prepared by curing a silicone elastic coating agent (Sylgard 184 (Dow corning)) on a silicon oxide master made to form a plurality of cylindrical nano-patterns. A pattern corresponding to the nano-patterns formed on the silicon oxide master is formed on a bottom surface in contact with the first solution coated on the substrate 400 of the PDMS mold manufactured as described above.

The evaporating of the first solvent in S13 is performed after the seating of the first PDMS mold in S12. In the evaporating of the first solvent in S13, a solvent of the first solution applied on the substrate 400 is evaporated. According to an embodiment, in the evaporating of the first solvent in S13, the solvent is evaporated in an electric furnace at 170° C. for 20 minutes to form a precursor nano-pattern.

The removing of the first PDMS in S14 is performed after the evaporating of the first solvent in S13. In the removing of the first PDMS in S14, the PDMS mold is removed from the substrate 400 on which the evaporating of the first solvent in S13 is completed.

The first heating in S15 is performed after the removing of the first PDMS in S14. In the first heating in S15, the substrate 400 is heated. According to an embodiment, in the first heating in S15, the substrate 400 on which the precursor nano-pattern is formed is heated at a temperature of 800 to 1000° C. for 2 hours in a tube electric furnace and cooled to room temperature after heating for 2 hours to form the first structure.

Figure 4:
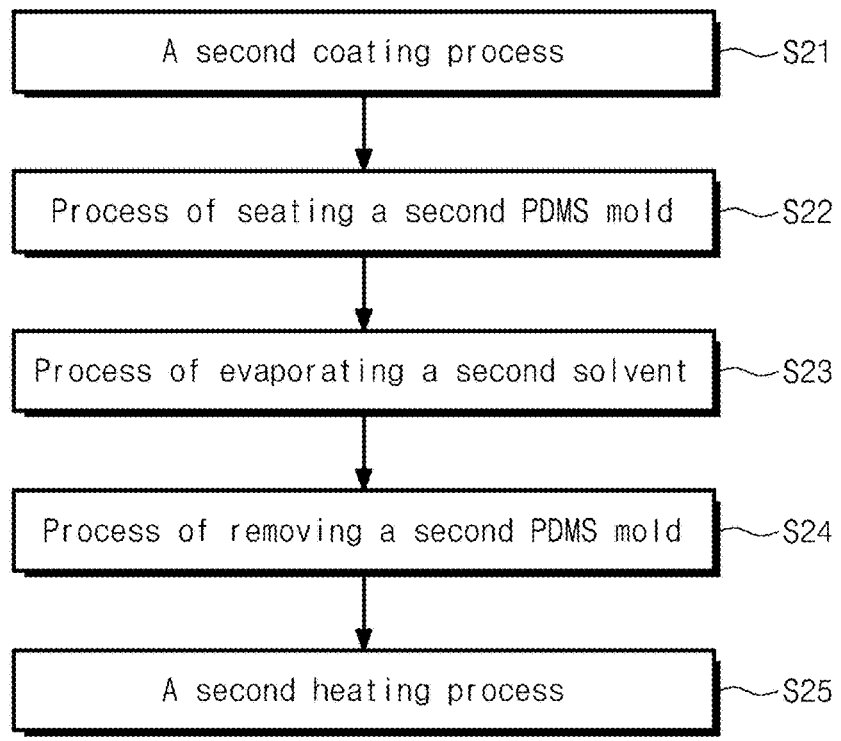
FIG. 4 is a flowchart illustrating a forming of a second structure of FIG. 2.

FIG. 4 is a flowchart illustrating the forming of the second structure in S20 of FIG. 2. Referring to FIGS. 1 and 4, in the forming of the second structure in S20, the second structure 200 is formed on the substrate 400 on which the first structure 100 is formed in the forming of the first structure in S10. According to an embodiment, the forming of the second structure in S20 includes second coating in S21, seating a second PDMS mold in S22, evaporating a second solvent in S23, removing the second PDMS mold in S24, and second heating in S25. The second coating in S21, the seating of the second PDMS mold in S22, the evaporating of the second solvent in S23, the removing of the second PDMS mold in S24, and the second heating in S25 are sequentially performed with one another.

In the second coating in S21, a second solution in which components constituting the second material are dissolved is applied on the substrate 400 on which the first structure 100 is formed in the forming of the first structure in S10.

In the seating of the second PDMS mold in S22, the PDMS mold is seated on the substrate 400 on which the second solution is applied in the second coating in S21. In this case, the PDMS mold is rotated at an angle about a virtual axis extending perpendicular to a top surface of the substrate 400 from a point on the top surface of the substrate 400 with respect to the PDMS mold seated in the seating of the first PDMS mold in S12 to be seated on the substrate 400 on which the second solution is applied. For example, when the third structure 300 is not provided in the down-converted light emitting combination 10, the PDMS mold is rotated by $\pi/6$ with respect to the PDMS mold seated in the seating of the first PDMS mold in S12 to be seated on the substrate 400 on which the second solution is applied. Alternatively, when the third structure 300 is provided in the down-converted light emitting combination 10, the PDMS mold is rotated by $\pi/9$ with respect to the PDMS mold seated in the seating of the first PDMS mold in S12 to be seated on the substrate 400 on which the second solution is applied. A mold having the same shape as the PDMS mold used in the seating of the first PDMS mold in S12 may be used as the mold in the seating of the second PDMS mold in S22. A portion of the PDMS mold used in the seating of the second PDMS mold in S22, which is in contact with the first structure 100, is naturally contracted because the PDMS mold itself has elasticity to prevent the first structure 100 from being damaged by the seating of the PDMS mold or to prevent the PDMS mold from being lifted by the first structure 100.

In the evaporating of the second solvent in S23, a solvent of the second solution of the substrate 400 in which the seating of the second PDMS mold in S22 is completed is evaporated.

In the removing of the second PDMS in S24, the PDMS mold is removed from the substrate 400 in which the evaporating of the second solvent in S23 is completed.

In the second heating in S25, the substrate 400 in which the evaporating of the second solvent in S23 is completed is heated.

A specific method other than the second coating in S21, the seating of the second PDMS mold in S22, the evaporating of the second solvent in S23, the removing of the second PDMS mold in S24, and the second heating in S25 may be the same as the first coating in S11, the seating of the first PDMS mold in S12, the evaporating of the first solvent in S13, the removing of the first PDMS mold in S14, and the first heating in S15.

Figure 5:
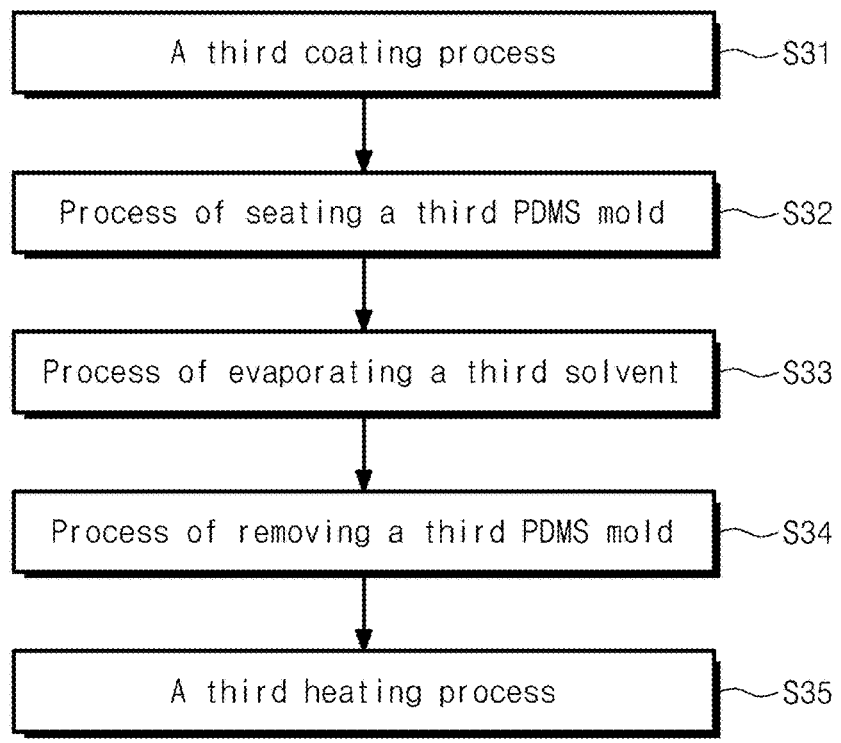
FIG. 5 is a flowchart illustrating a forming of a third structure of FIG. 2.

FIG. 5 is a flowchart illustrating the forming of the third structure in S30 of FIG. 2. Referring to FIGS. 1 and 5, in the forming of the third structure in S30, the third structure 300 is formed on the substrate 400 on which the first structure 100 and the second structure 200 are formed in the forming of the first structure in S10 and the forming of the second structure in S20. The forming of the third structure in S30 is not performed when the third structure 300 is not selectively provided. According to an embodiment, the forming of the third structure in S30 includes third coating in S31, seating a third PDMS mold in S32, evaporating a third solvent in S33, removing the third PDMS mold S34, and third heating in S35. The third coating in S31, the seating of the third PDMS mold in S32, the evaporating the third solvent in S33, the removing of the third PDMS mold S34, and the third heating in S35 are sequentially performed with one another.

In the third coating in S31, a third solution in which components constituting the third material are dissolved is applied on the substrate 400 on which the first structure 100 and the second structure 200 are formed in the forming of the first structure in S10 and the forming of the second structure in S20.

In the seating of the third PDMS mold in S32, the PDMS mold is seated on the substrate 400 on which the third solution is applied in the third coating in S31. In this case, the PDMS mold is rotated at a predetermined angle with respect to the PDMS mold seated in the seating of the second PDMS mold in S22 to be seated on the substrate 400 on which the third solution is applied. For example, the PDMS mold is rotated at $\pi/9$ about a virtual axis extending perpendicular to the top surface of the substrate 400 from a point on the top surface of the substrate 400 with respect to the PDMS mold seated in the seating of the second PDMS mold in S22 to be seated on the substrate 400 on which the third solution is applied. In this case, a PDMS mold having the same shape as the PDMS mold used in the seating of the first PDMS mold in S12 and/or the PDMS mold used in the seating of the second PDMS mold in S22 may be used as the PDMS mold in the seating of the third PDMS mold in S32.

In the evaporating of the third solvent in S33, the solvent of the third solution of the substrate 400 on which the seating of the third PDMS mold in S32 is completed is evaporated.

In the removing of the third PDMS in S34, the PDMS mold is removed from the substrate 400 in which the evaporating of the third solvent in S33 is completed.

In the third heating in S35, the substrate 400 in which the evaporating of the third solvent in S33 is completed is heated.

A specific method other than the third coating in S31, the seating of the third PDMS mold in S32, the evaporating of the third solvent in S33, the removing of the third PDMS mold in S34, and the third heating in S35 may be the same as the first coating in S11, the seating of the first PDMS mold in S12, the evaporating of the first solvent in S13, the removing of the first PDMS mold in S14, and the first heating in S15.

According to an embodiment, $Y(NO_3)_3 \cdot 6H_2O$, citric acid, and $Eu(NO_3)_3 \cdot 6H_2O$, $Bi(NO_3)_3 \cdot 4H_2O$, or $Er(NO_3)_3 \cdot 5H_2O$ are mixed in a 2-methoxyethanol solvent to prepare the first solution, the second solution, and the third solution. Alternatively, $VO(acac)_2$ may be further mixed in the 2-methoxyethanol solvent with the above-mentioned solutes to prepare the first solution, the second solution, and the third solution. For example, the first material, the second material, or the third material is prepared as follows.

When the first material, the second material, or the third material is made of $YVO_4:Eu^{3+}$, or $YVO_4:Bi^{3+}$, 1.637 g (4.275 mmol) of $Y(NO_3)_3 \cdot 6H_2O$, 1.729 g (9.0 mmol) of citric acid, and 1.193 g (4.5 mmol) of $VO(acac)_2$ is mixed to a 3 ml of 2-methoxyethanol solvent, and 100 mg (225 mmol) of $Eu(NO_3)_3 \cdot 6H_2O$, or 105 mg (225 mmol) of $Bi(NO_3)_3 \cdot 4H_2O$ is added to the above solution for doping. When the first material, the second material, or the third material is made of $YVO_4:Er^{3+}$, 1.689 g (4.410 mmol) of $Y(NO_3)_3 \cdot 6H_2O$, 1.729 g (9.0 mmol) of citric acid, and 1.193 g (4.5 mmol) of $VO(acac)_2$ is mixed to a 3 ml of 2-methoxyethanol solvent, and 40 mg (90 mmol) of $Er(NO_3)_3 \cdot 5H_2O$ is added to the above solution for doping. Alternatively, when the first material, the second material, or the third material is made of yttrium oxide doped with a lanthanide ion, 3.562 g (9.3 mmol) of $Y(NO_3)_3 \cdot 6H_2O$ is mixed in a mixed solvent of 1 ml of 2-methoxyethanol and 1 ml of acetic acid, and 312 mg (700 mmol) of $Eu(NO_3)_3 \cdot 6H_2O$ or 93 mg (200 mmol) of $Bi(NO_3)_3 \cdot 4H_2O$ is added to the above solution for doping.

Thereafter, the mixed solution as described in the above paragraph is magnetically stirred for 1 hour at a temperature of 90° C. to prepare a transparent first solution, a transparent second solution, or a transparent third solution.

Hereinafter, evaluation of a yttrium vanadium oxide thin film or a yttrium oxide thin film which is doped with the lanthanide ion as the above-described, a nano-patterned thin film, and a double print (when the third structure is not provided), and a triple print (when the third structure is provided) will be described.

Photographing of shapes of a flat thin film, the nano-patterned thin film, the double print, and triple print was performed using a scanning electron microscope (SEM, Hitachi, S-4800, S-4700). An X-ray diffraction analyzer (Rigaku D, max-250 V/PC) was used for crystallographic structure analysis of the yttrium vanadium oxide thin film. An X-ray photoelectron analyzer (XPS, ULVAC-PHI, X-TOOL) was used for surface component analysis. A Raman spectroscopy (Horiba Jobin Yvon, LabRam ARAMIS IR2) was used for Raman spectral spectrum measurement. The down-converted light emission spectra of the flat thin film and the nano-patterned thin film were measured by 355 nm pulsed laser and spectrometer (Ocean optics, HR2000+) through triple frequency control of Nd:YAG 1064 nm laser (Continuum, Powerlite Precision laser II 8000). The down-conversion light emission spectrum of the nano-pattern in the case of double printing and triple printing was measured by a fluorescence spectrophotometer (Agilent, Cary Eclipse). For time-resolved emission attenuation spectrum measurement, a 266 nm pulse laser, a monochromator (Andor technology, SR-303i), and a photoelectron amplifier (Hamamatsu, R955) using a frequency quadruple control of an Nd:YAG 1064 nm laser were used. A UV-VIS-NIR spectrometer (Agilent, Cary 5000, Cary 50) was used for transmittance measurement.

FIG. 6 is photographs and graphs for morphological and structural analysis of a lanthanide ion-doped yttrium vanadium oxide thin film formed flat. FIG. 6A is a plan view of a europium-doped yttrium vanadium oxide thin film observed through a scanning electron microscope. FIG. 6B is a plan view of a bismuth-doped yttrium vanadium oxide thin film observed through a scanning electron microscope. FIG. 6C is a side view of a europium-doped yttrium vanadium oxide thin film observed through a scanning electron microscope. FIG. 6D is a side view of a bismuth-doped yttrium vanadium oxide thin film observed through a scanning electron microscope. FIG. 6E is X-ray diffraction patterns of a europium-doped yttrium vanadium oxide thin film and a bismuth-doped yttrium vanadium oxide thin film, respectively. FIG. 6F is Raman spectral spectra of a europium-doped yttrium vanadium oxide thin film and a bismuth-doped yttrium vanadium oxide thin film, respectively.

Figure 6A:
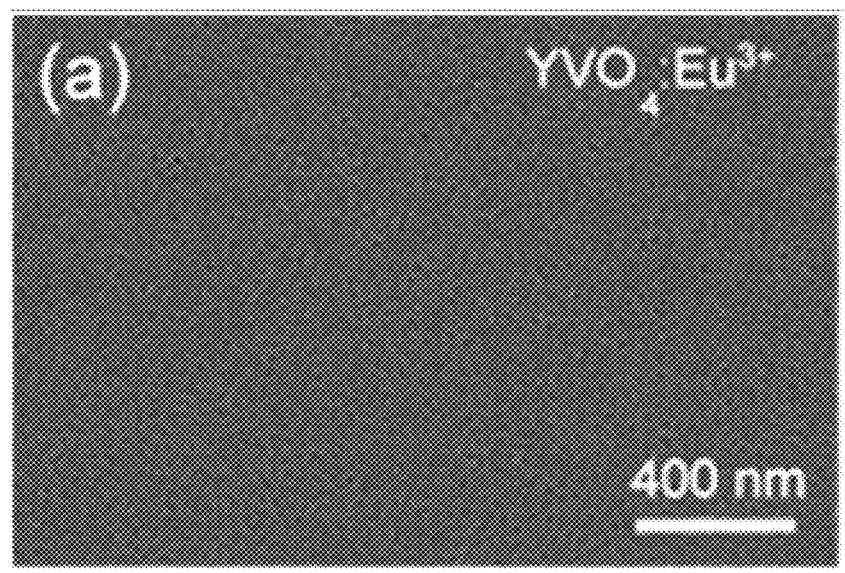
FIG. 6A-FIG. 6F are photographs and graphs for morphological and structural analysis of a lanthanide ion-doped yttrium vanadium oxide thin film formed flat.
Figure 6B:
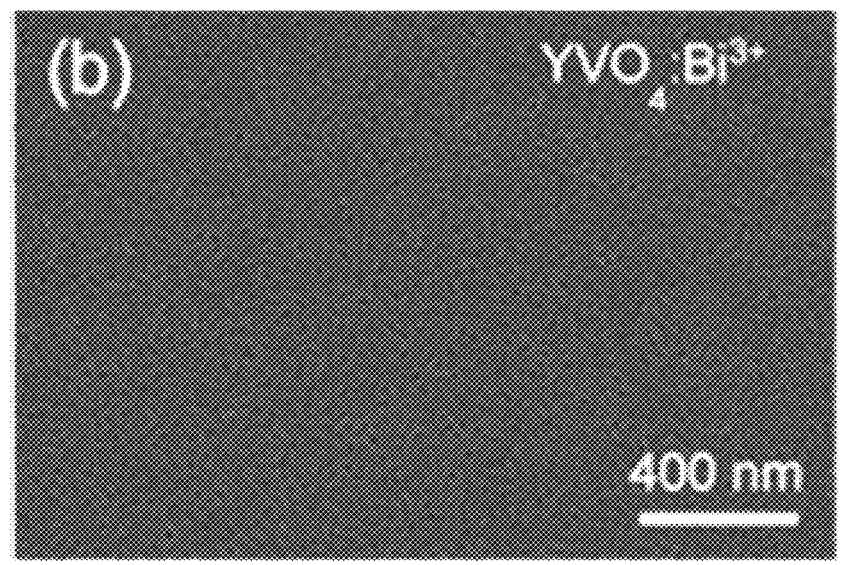
Figure 6C:
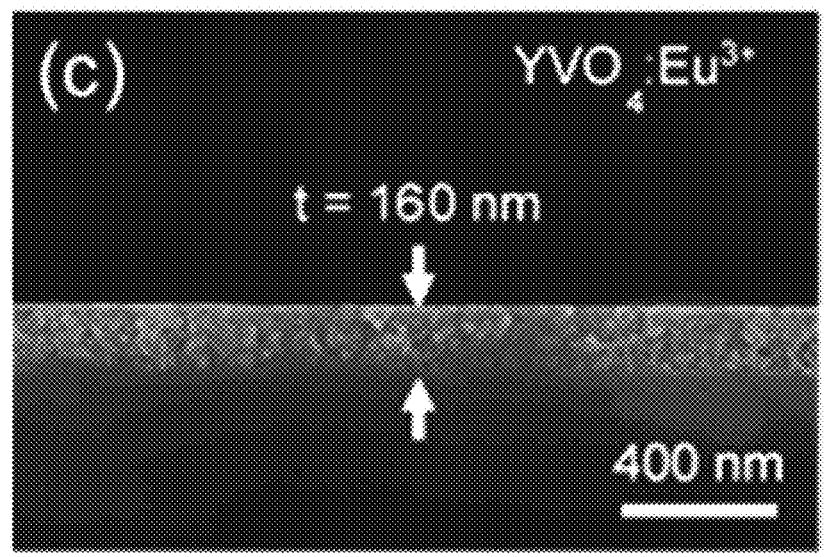
Figure 6D:
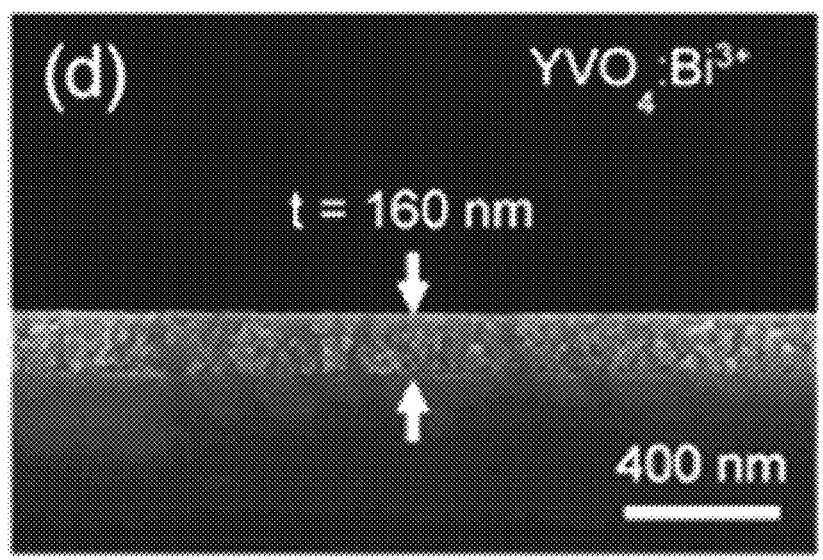
Figure 6E:
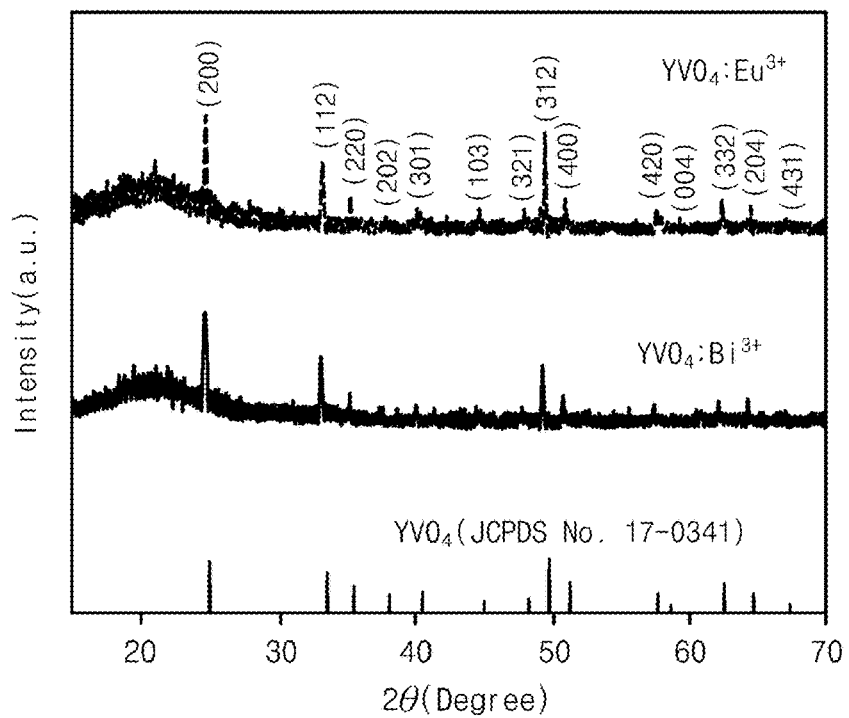
Figure 6F:
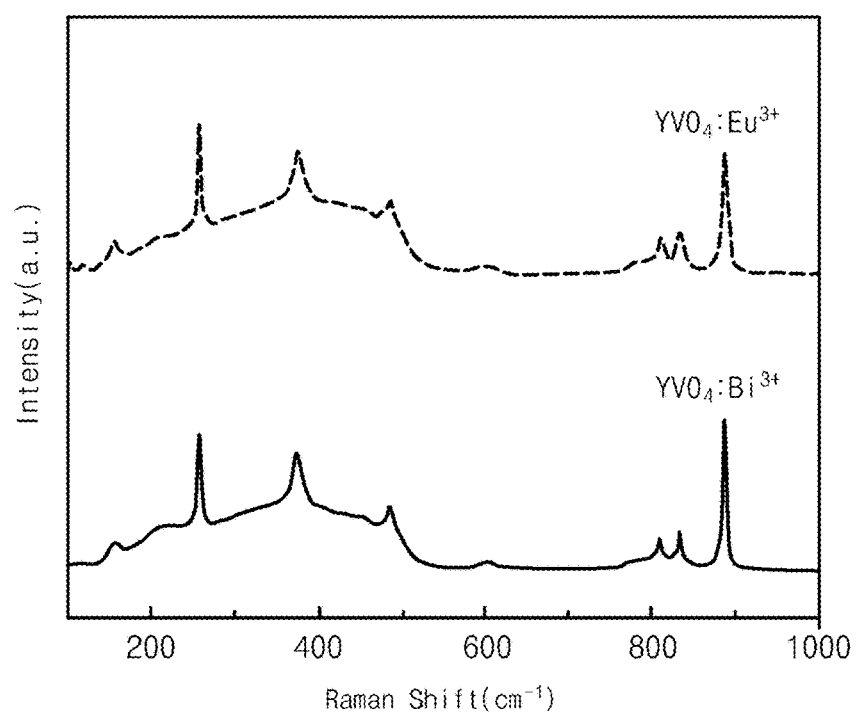
Figure 7A:
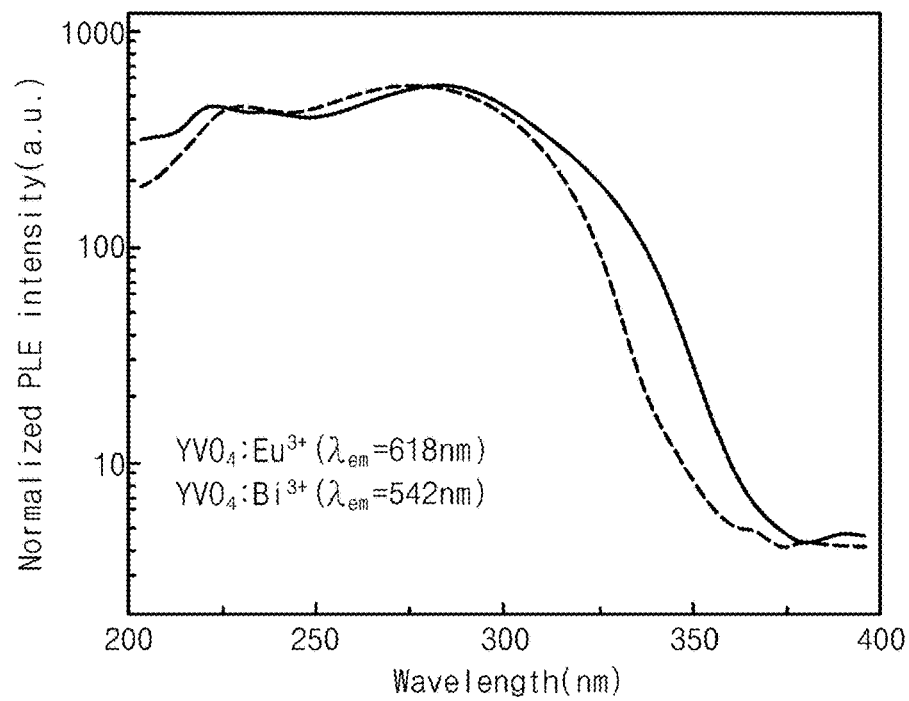
FIG. 7A-FIG. 7D are graphs illustrating light absorption and light emission characteristics of a lanthanide ion-doped yttrium vanadium oxide thin film formed flat.
Figure 7B:
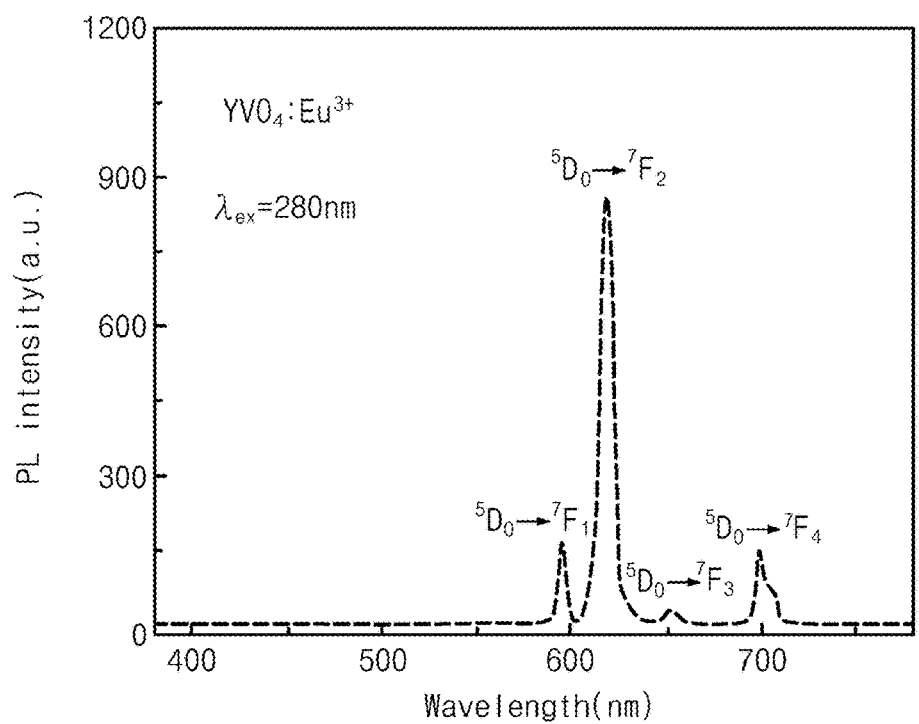
Figure 7C:
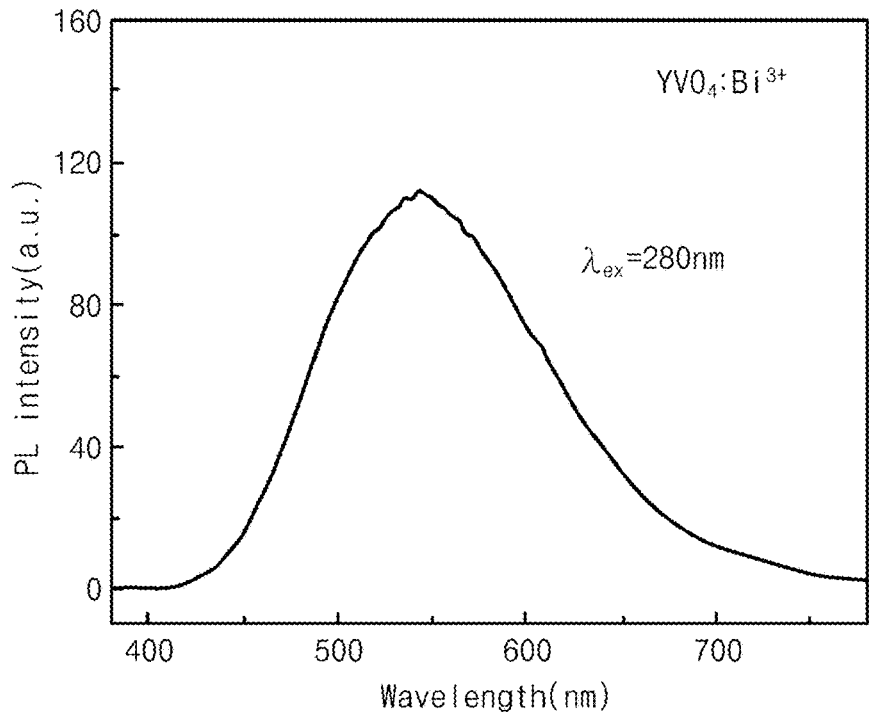
Figure 7D:
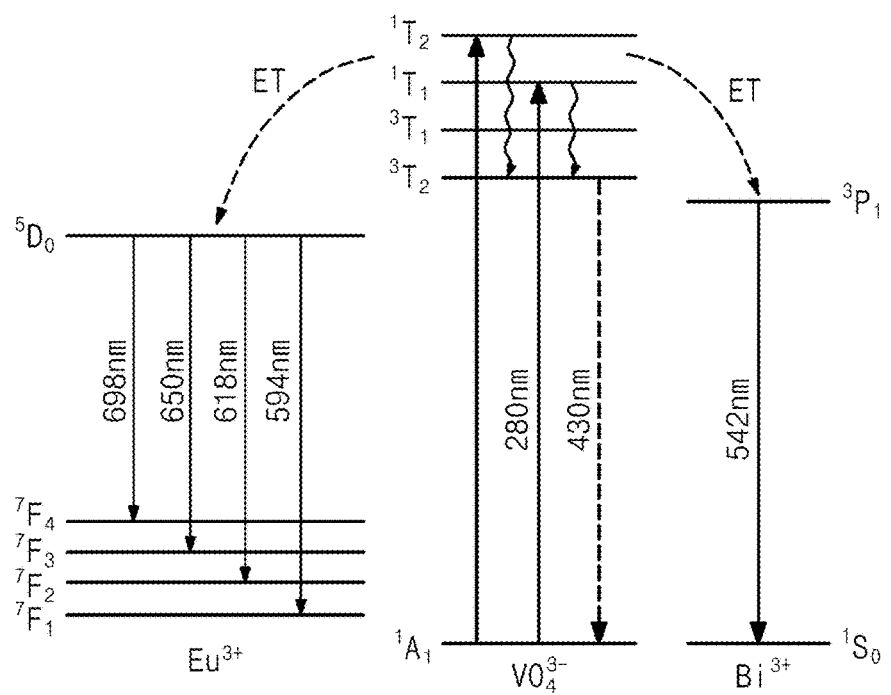

$Y(NO_3)_3 \cdot 6H_2O$ (546 mg, 1.4 mmol), citric acid (576 mg, 3.0 mmol), $VO(acac)_2$ (398 mg, 1.5 mmol), $Eu(NO_3)_3 \cdot 6H_2O$ (33 mg, 75 μmol) were input into 2-methoxyethanol (6 mL), and then were magnetically stirred for 90° C. for 1 hour in a capped vial until it became a clear solution, to prepare the $YVO_4$:$Eu^{3+}$ thin film illustrated in FIG. 6C. 40 ul of the synthesized solution was poured onto a $SiO_2$/Si or quartz substrate (15×15 mm), and then spin-coated at 3000 rpm for 20 seconds to manufacture a flat thin film. A coated thin film sample was heated in a tube furnace at ambient air, 5° C./min heating rate, and 900° C. for 2 hours. The $YVO_4$:$Bi^{3+}$ thin film illustrated in FIG. 6D was prepared by the same process as above except that $Bi(NO_3)_3 \cdot 4H_2O$ (35 mg, 75 μmol) was added instead of $Eu(NO_3)_3 \cdot 6H_2O$ (33 mg, 75 μmol).

Referring to FIG. 6, the shape of the yttrium vanadium oxide thin film having a flat surface and a uniform thickness may be confirmed. In addition, it may be seen that all thin films have a tetragonal crystal structure, respectively.

FIG. 7 is graphs illustrating light absorption and light emission characteristics of a lanthanide ion-doped yttrium vanadium oxide thin film formed flat. FIG. 7A is a graph illustrating light absorption spectra of the europium-doped yttrium vanadium oxide thin film and the bismuth-doped yttrium vanadium oxide thin film on a logarithmic scale. FIG. 7B is a light emission spectrum of the europium-doped yttrium vanadium oxide thin film. FIG. 7C is a light emission spectrum of the bismuth-doped yttrium vanadium oxide thin film. FIG. 7D is a schematic diagram illustrating energy levels and energy transfer of the europium-doped yttrium vanadium oxide thin film and the bismuth-doped yttrium vanadium oxide thin film. Referring to FIG. 7A, it may be seen that the thin films absorb an ultraviolet light region. Referring to FIGS. 7B and 7C, it may be seen that the thin films emit the visible light with the ultraviolet light absorbed. Referring to FIG. 7D, the light absorption and emission characteristics and mechanisms of the thin films may be confirmed.

FIG. 8 is photographs illustrating morphologies of a europium-doped yttrium vanadium oxide nano-pattern thin film and a bismuth-doped yttrium vanadium oxide nano-pattern thin film according to an embodiment of the inventive concept, and graphs improved luminescence characteristics compared to a general (flat) thin film. FIG. 8A is a tilted image of the europium-doped yttrium vanadium oxide nano-pattern thin film observed through a scanning electron microscope. FIG. 8B is a tilted image of the bismuth-doped yttrium vanadium oxide nano-pattern thin film observed through a scanning electron microscope. FIG. 8C is light emission spectra under 355 nm laser irradiation of a europium-doped yttrium vanadium oxide general thin film and the europium-doped yttrium vanadium oxide nano-pattern thin film. FIG. 8D is light emission spectra under 355 nm laser irradiation of a bismuth-doped yttrium vanadium oxide general thin film and the bismuth-doped yttrium vanadium oxide nano-pattern thin film. FIG. 8E is photographic images of light emission under irradiation of a 365 nm ultraviolet lamp of the europium-doped yttrium vanadium general oxide thin film and europium-doped yttrium vanadium oxide nano-pattern thin film. FIG. 8F is photographic images of light emission under irradiation of a 365 nm ultraviolet lamp of the bismuth-doped yttrium vanadium oxide general thin film and the bismuth-doped yttrium vanadium oxide nano-pattern thin film.

Figure 8A:
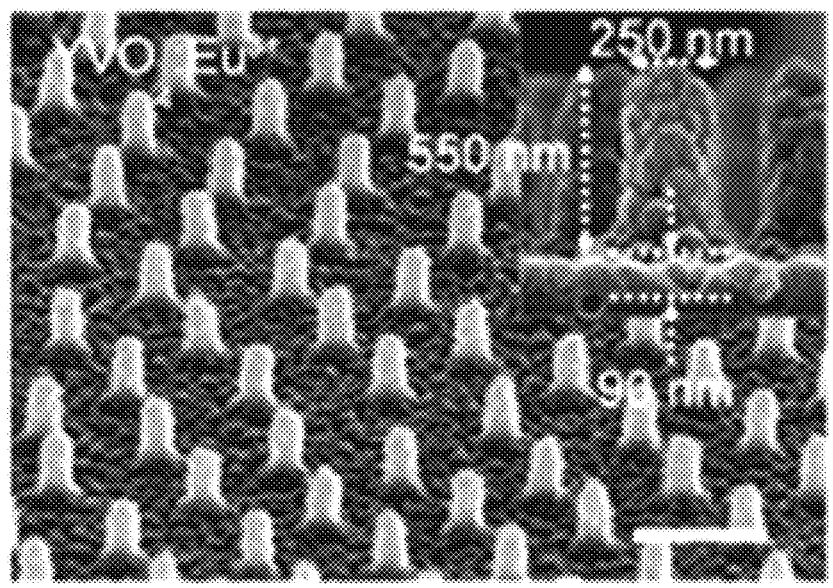
FIG. 8A-FIG. 8F are photographs illustrating morphologies of a europium-doped yttrium vanadium oxide nano-pattern thin film and a bismuth-doped yttrium vanadium oxide nano-pattern thin film according to an embodiment of the inventive concept, and graphs improved luminescence characteristics compared to a general (flat) thin film.

$Y(NO_3)_3 \cdot 6H_2O$ (1.637 g, 4.275 mmol), citric acid (1.729 g, 9.0 mmol), and $VO(acac)_2$ (1.193 g, 4.5 mmol) were mixed with 2-methoxyethanol (3 mL) to prepare the $YVO_4$:$Eu^{3+}$ nano-pattern thin film illustrated in FIG. 8A. $Eu(NO_3)_3 \cdot 6H_2O$ (100 mg, 225 μmol) was mixed with the above solution for doping, and the mixed solution was magnetically stirred in a capped vial at 90° C. for 1 hour until it became a clear solution. The nano-pattern thin film was produced through a soft nano-imprint lithography process. First, a $SiO_2$ nano-patterned master having a height of 1.2 m, a diameter of 650 nm, and a spacing of 1.0 μm (a spacing of 2.0 μm in a triple printing) was prepared. The nano-patterned master was fabricated with a polystyrene beads layer through a reactive ion etching process. In this case, an aluminum layer (aluminum layer) was used as an etch mask. Sylgard 184 (Dow corning) was coated on the nano-patterned master and cured to prepare a nano-patterned PDMS mold. A small amount of the synthesized solution was poured onto a quartz substrate, and the prepared PDMS mold was pressed. Next, after heating at 170° C. in a furnace for 20 minutes, the PDMS mold was removed. The nano-patterned thin film fabricated on the substrate was heated in a tube furnace for 2 hours at ambient air, 5° C./min heating rate, and 900° C. The $YVO_4:Bi^{3+}$ nano-pattern thin film illustrated in FIG. 8B was prepared by the same process as above except that $Bi(NO_3)_3.4H_2O$ (105 mg, 225 μmol) was mixed with the solution instead of $Eu(NO_3)_3.6H_2O$ (100 mg, 225 μmol).

Figure 8B:
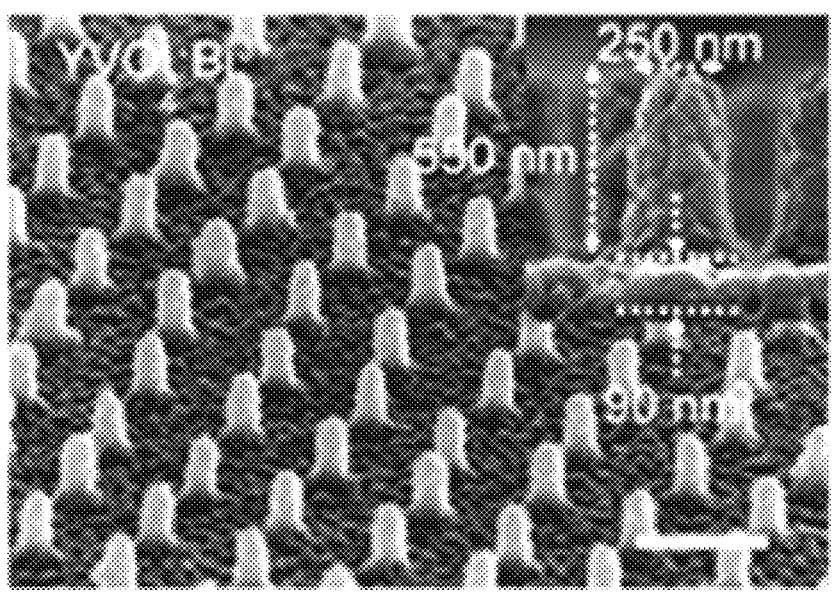
Figure 8C:
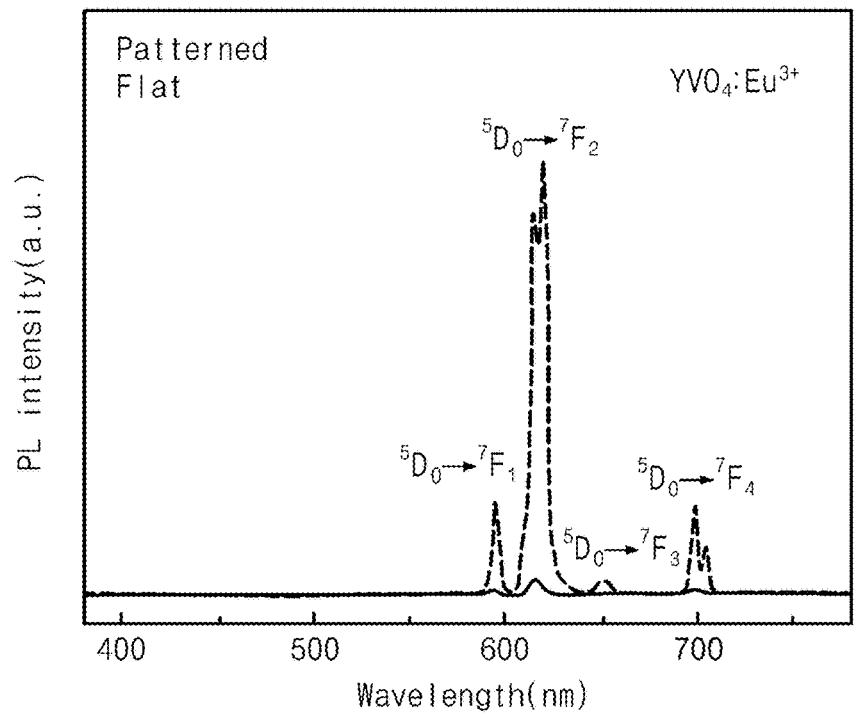
Figure 8D:
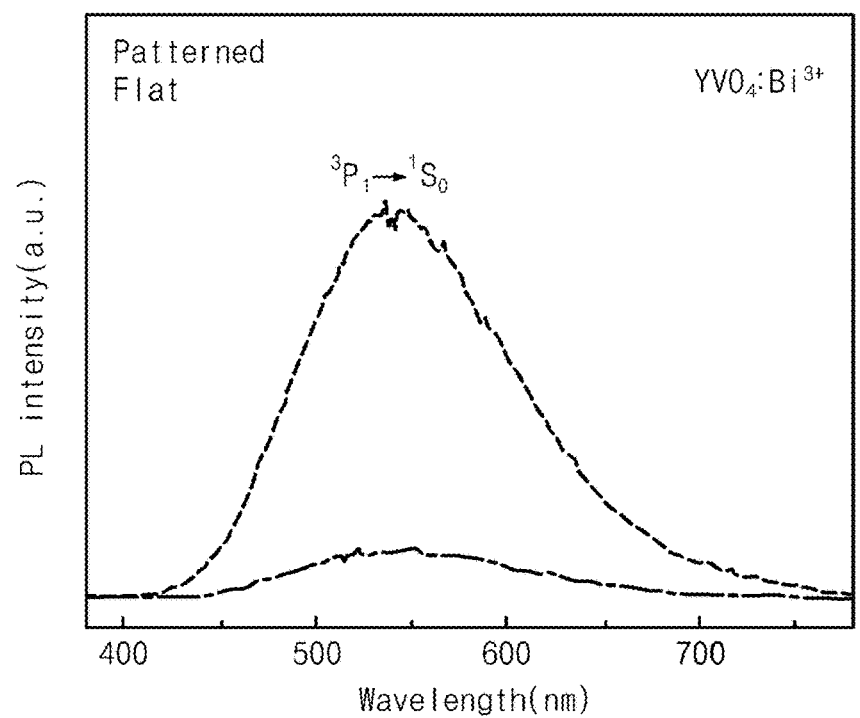
Figure 8E:
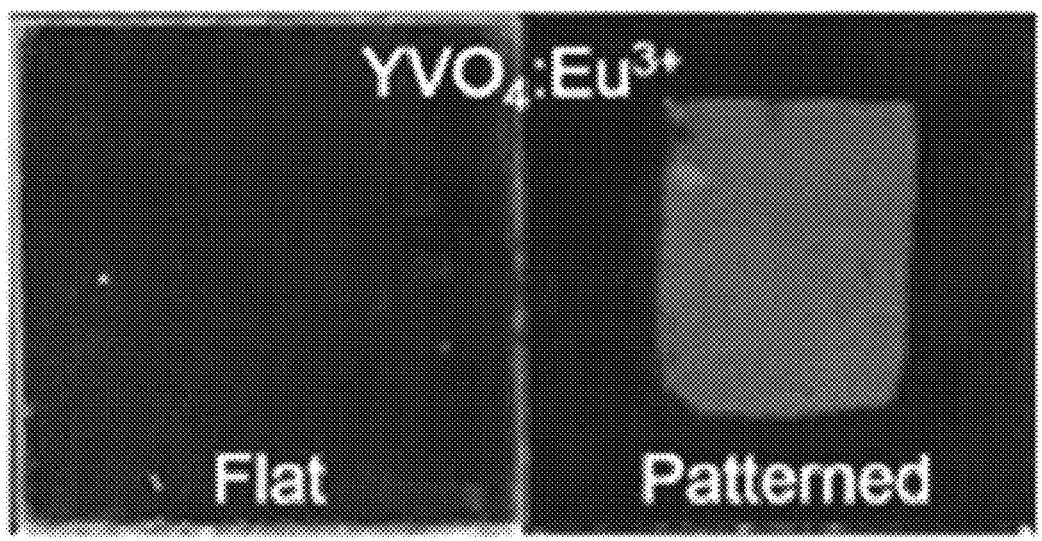
Figure 8F:
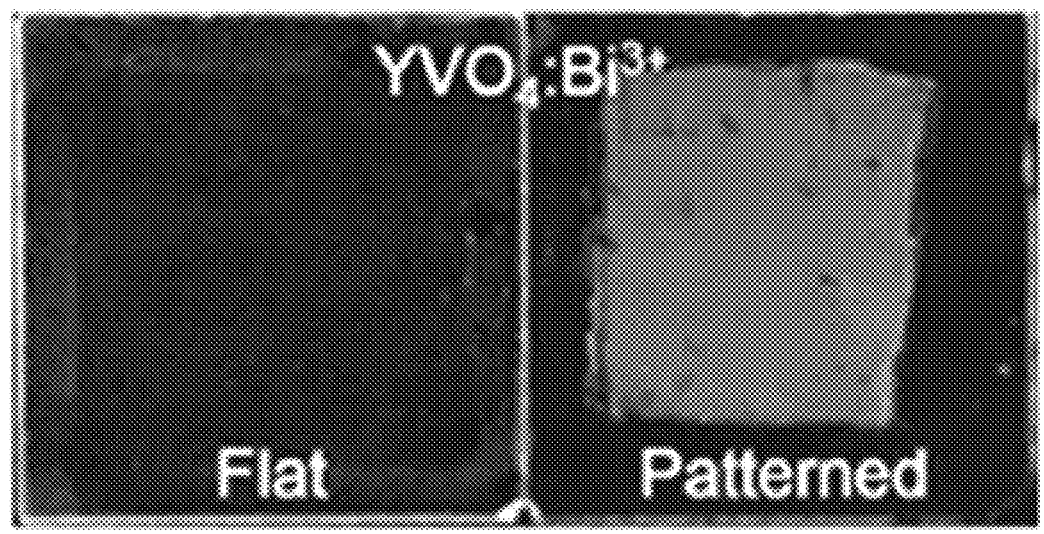

Referring to FIGS. 8A and 8B, the shapes of the nano-pattern thin films may be confirmed. Referring to FIGS. 8C and 8D, it may be seen that luminance characteristics of the thin films through nano-patterning are greatly improved compared to the flat general thin film. Referring to FIGS. 8E and 8F, it may be visually confirmed that luminance intensities of the thin films through nano-patterning were higher than that of the flat general thin film.

Figure 9A:
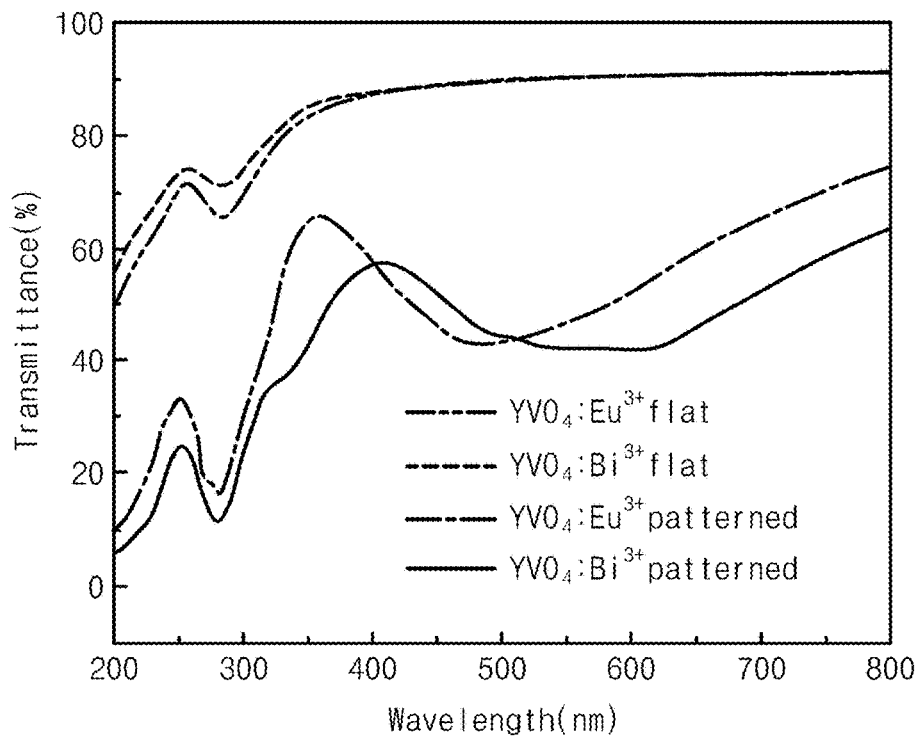
FIG. 9A-FIG. 9C are graphs analyzing a cause of improvement in luminance characteristics by nano-patterning according to an embodiment of the inventive concept.
Figure 9B:
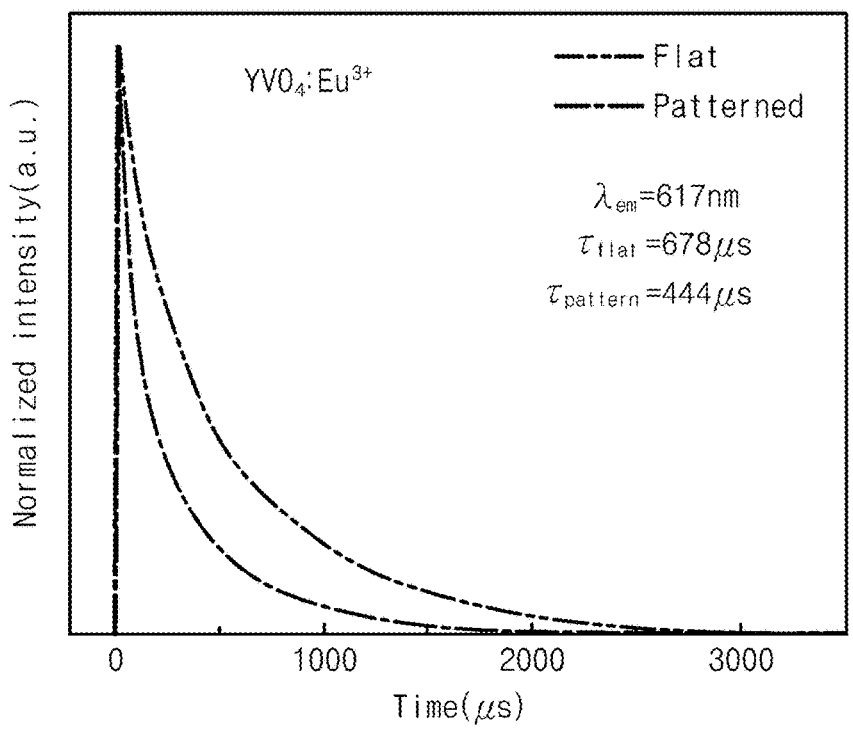
Figure 9C:
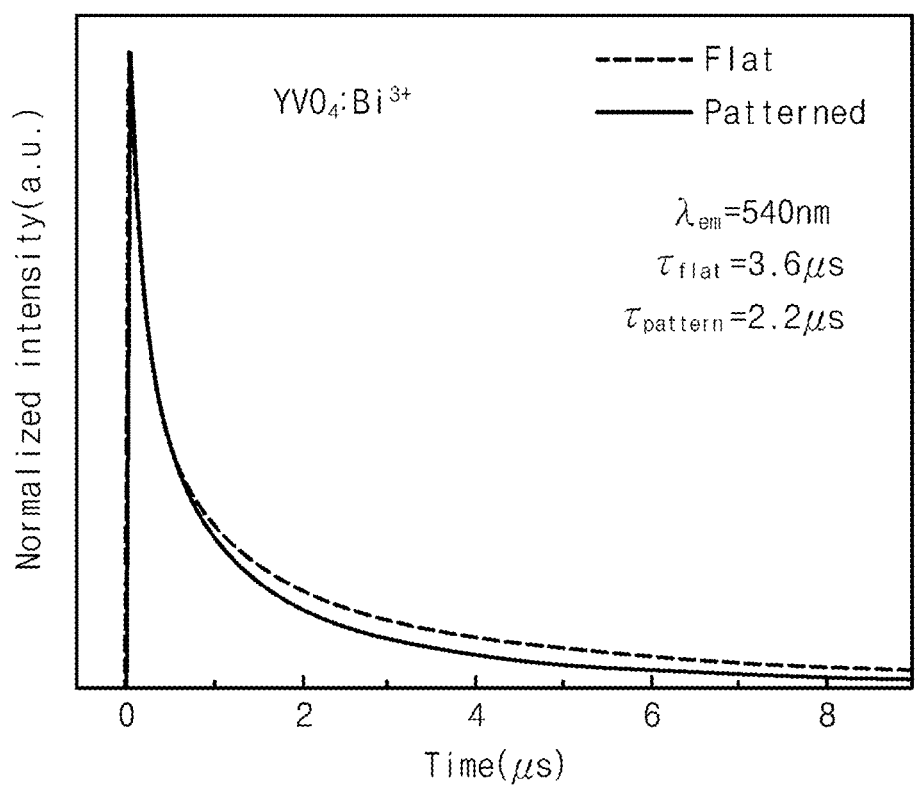

FIG. 9 is graphs analyzing a cause of improvement in luminance characteristics by nano-patterning according to an embodiment of the inventive concept. FIG. 9A is graphs of transmittances of a europium-doped yttrium vanadium oxide general thin film, a bismuth-doped yttrium vanadium oxide general thin film, a europium-doped yttrium vanadium oxide nano-pattern thin film, and a bismuth-doped yttrium vanadium oxide nano-pattern thin film. FIG. 9B is time-resolved emission attenuation spectra of a europium-doped yttrium vanadium oxide general thin film and a europium-doped yttrium vanadium oxide nano-pattern thin film. FIG. 9C is time-resolved emission attenuation spectra of a bismuth-doped yttrium vanadium oxide general thin film and a bismuth-doped yttrium vanadium oxide nano-pattern thin film. Referring to FIG. 9A, it may be seen that the nano-pattern thin films generate Mie resonance through a negative peak in a section of 250 to 650 nm, unlike the two spectra of the flat thin films. Scattering due to Mie resonance of the nano-pattern thin films may be confirmed. That is, the peak with reduced transmittance is generated due to scattering by Mie resonance. In addition, referring to FIGS. 9B and 9C, it may be seen that the attenuation rate of the nano-pattern thin films is faster than that of the flat thin films through radiative decay curves of the nano-pattern thin films. Accordingly, it may be seen that photons (lights) in the material escape more quickly in the nano-pattern due to Mie resonance to increase luminance efficiency.

FIG. 10 is photographs and graphs illustrating a shape and luminance characteristics of a double print according to an embodiment of the inventive concept. FIG. 10A is a scanning electron microscope image of a bismuth-doped yttrium vanadium oxide and europium-doped yttrium vanadium oxide double print. FIG. 10B is a light emission spectrum of a bismuth-doped yttrium vanadium oxide and europium-doped yttrium vanadium oxide double print. FIG. 10C illustrates light photographs under lamp irradiation of 254 nm ultraviolet light of a europium-doped yttrium vanadium oxide nano-pattern thin film, a bismuth-doped yttrium vanadium oxide nano-pattern thin film, and a bismuth-doped yttrium vanadium oxide and europium-doped yttrium vanadium oxide double print. FIG. 10D is a time-resolved emission decay spectrum at a 617 nm emission peak of a bismuth-doped yttrium vanadium oxide and europium-doped yttrium vanadium oxide double print. FIG. 10E is a time-resolved emission decay spectrum at a 540 nm emission peak of a bismuth-doped yttrium vanadium oxide and europium-doped yttrium vanadium oxide double print.

Figure 10A:
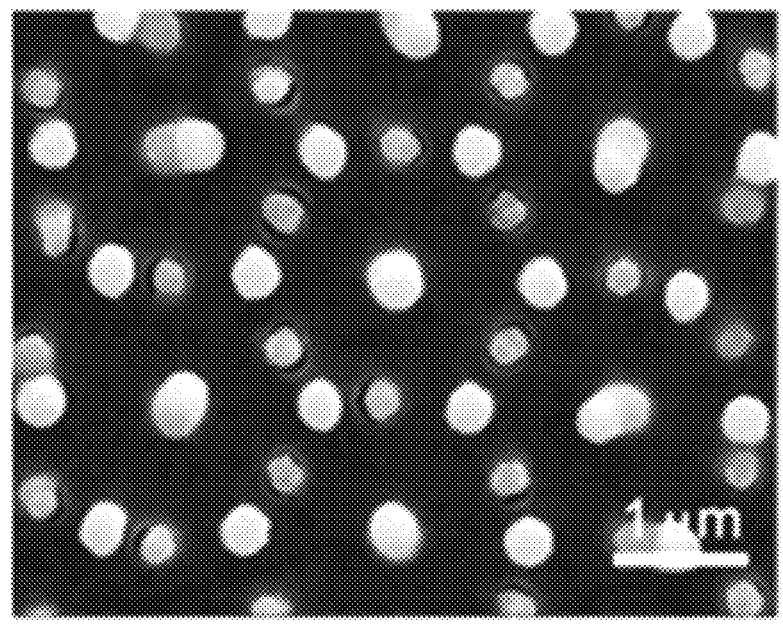
FIG. 10A-FIG. 10E are photographs and graphs illustrating a shape and luminance characteristics of a double print according to an embodiment of the inventive concept.
Figure 10B:
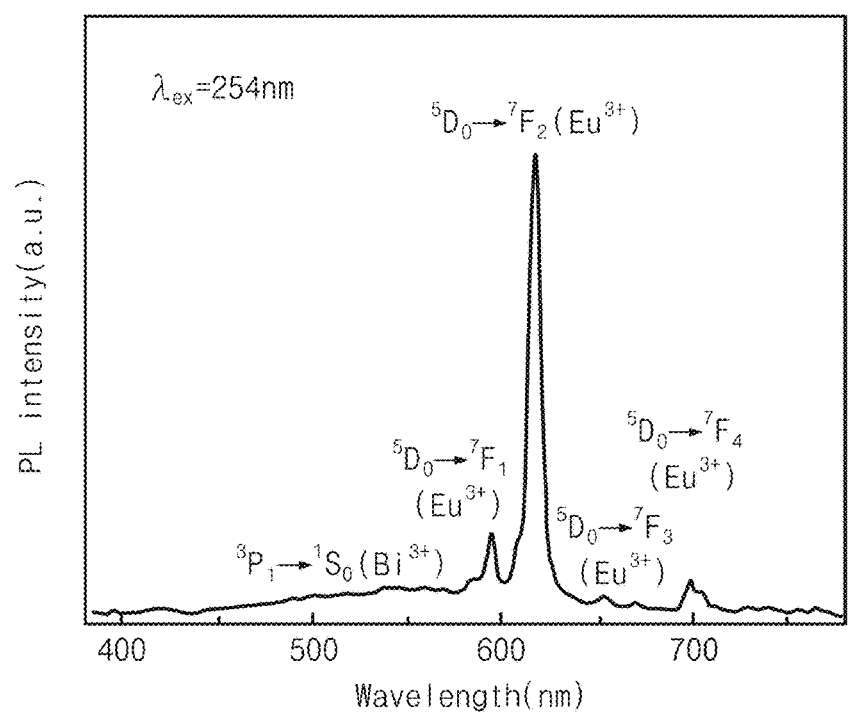
Figure 10C:
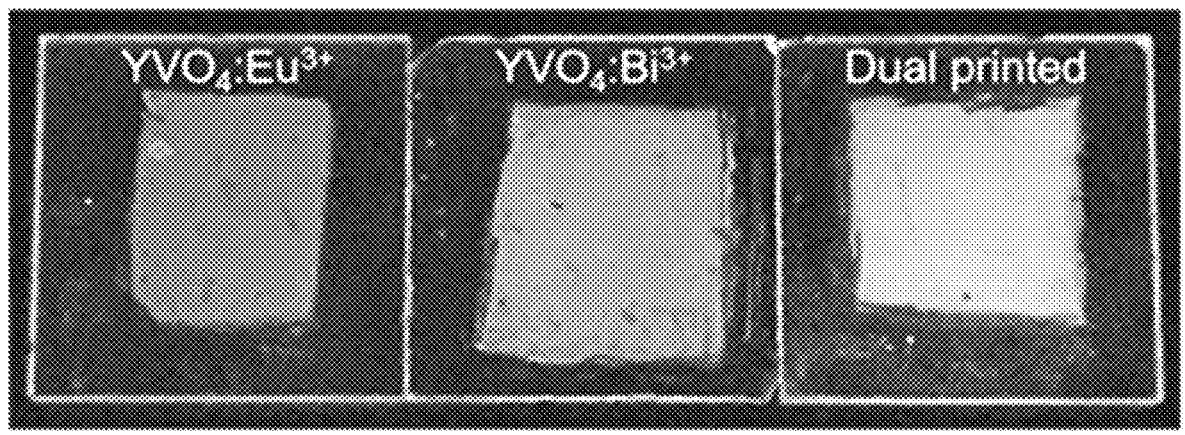

First, the $YVO_4:Bi^{3+}$ pattern of FIG. 8B was produced to prepare the $YVO_4:Bi^{3+}/YVO_4:Eu^{3+}$ double print illustrated in FIG. 10C. Next, a solution for $YVO_4:Eu^{3+}$ was dropped on the $YVO_4:Bi^{3+}$ pattern and the PDMS mold was pressed to prepare the $YVO_4:Eu^{3+}$ pattern. In this case, the second pattern ($YVO_4:Eu^{3+}$ pattern) was rotated by $\pi/6$ angle to minimize overlap with the first pattern ($YVO_4:Bi^{3+}$ pattern). After heating the furnace at 170° C. for 20 minutes, the PDMS mold was removed, and a heat process was performed at an ambient air, 5° C./min heating rate, and 900° C. for 2 hours.

Figure 10D:
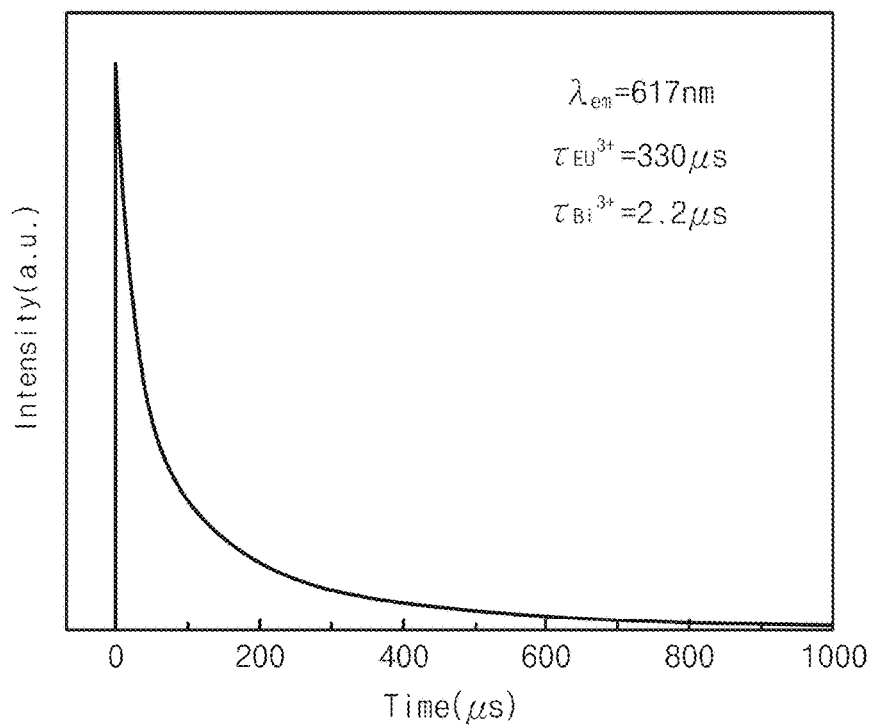
Figure 10E:
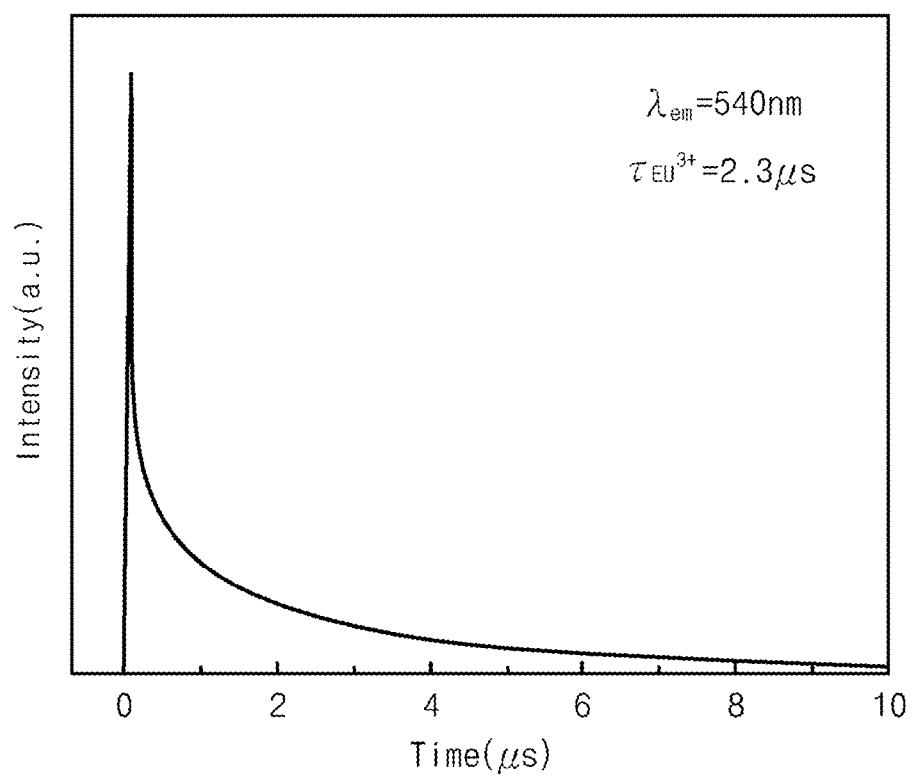
Figure 11A:
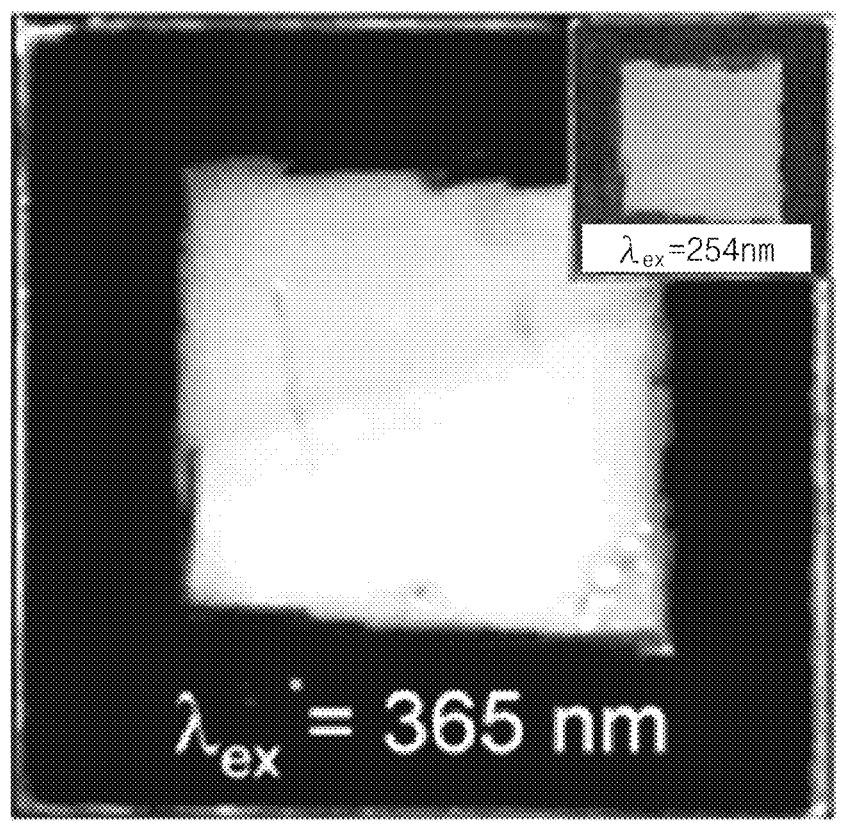
FIG. 11A-FIG. 11E are photographs, graphs and a diagram illustrating multi-color visible light conversion depending on an ultraviolet excitation wavelength of a double print according to an embodiment of the inventive concept.
Figure 11B:
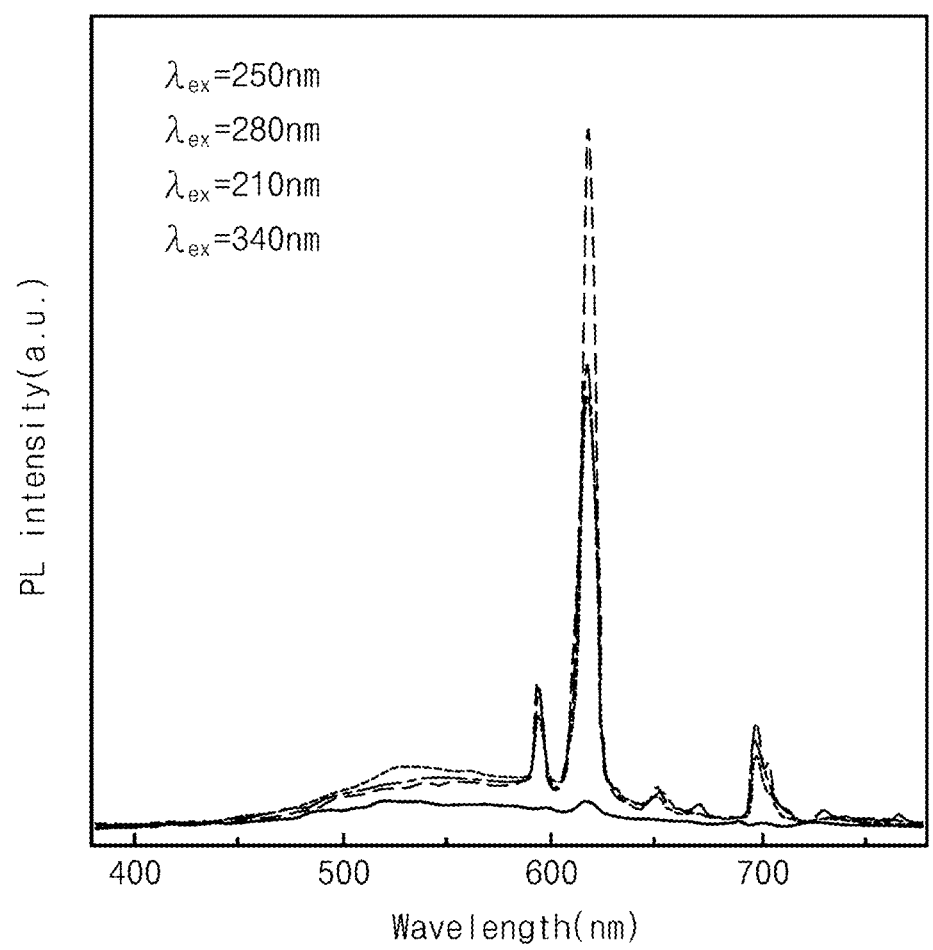
Figure 11C:
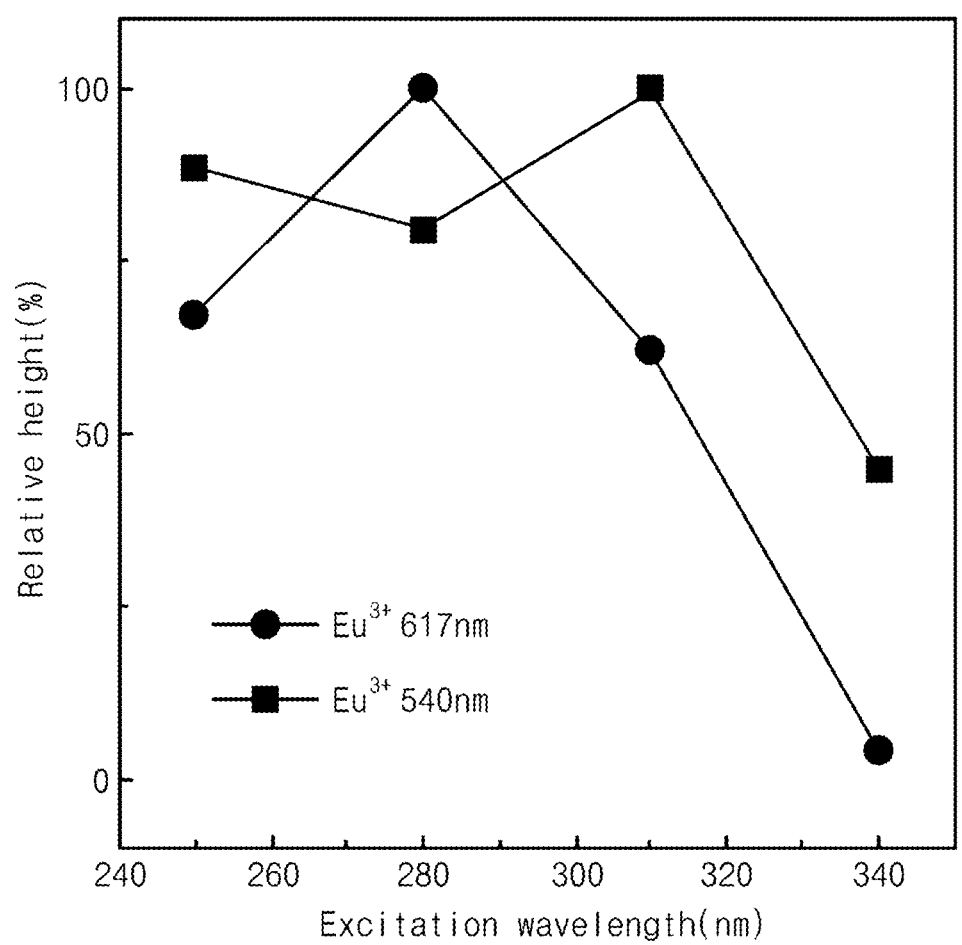
Figure 11D:
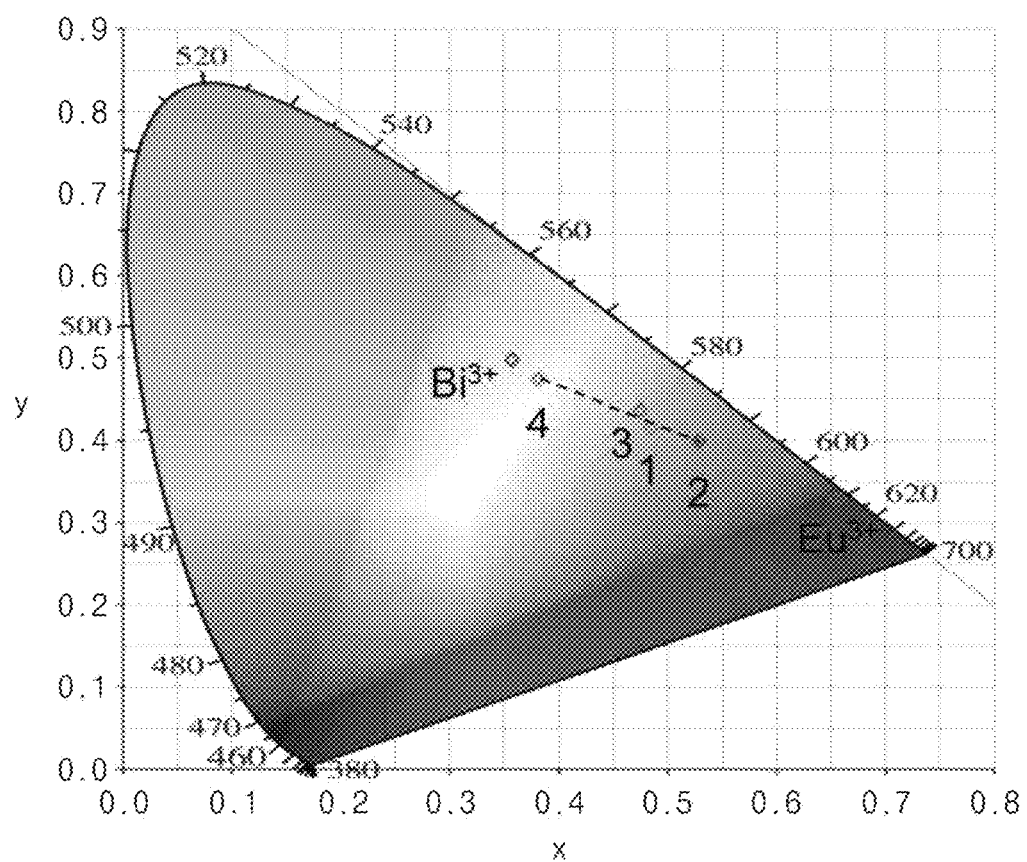
Figure 11E:
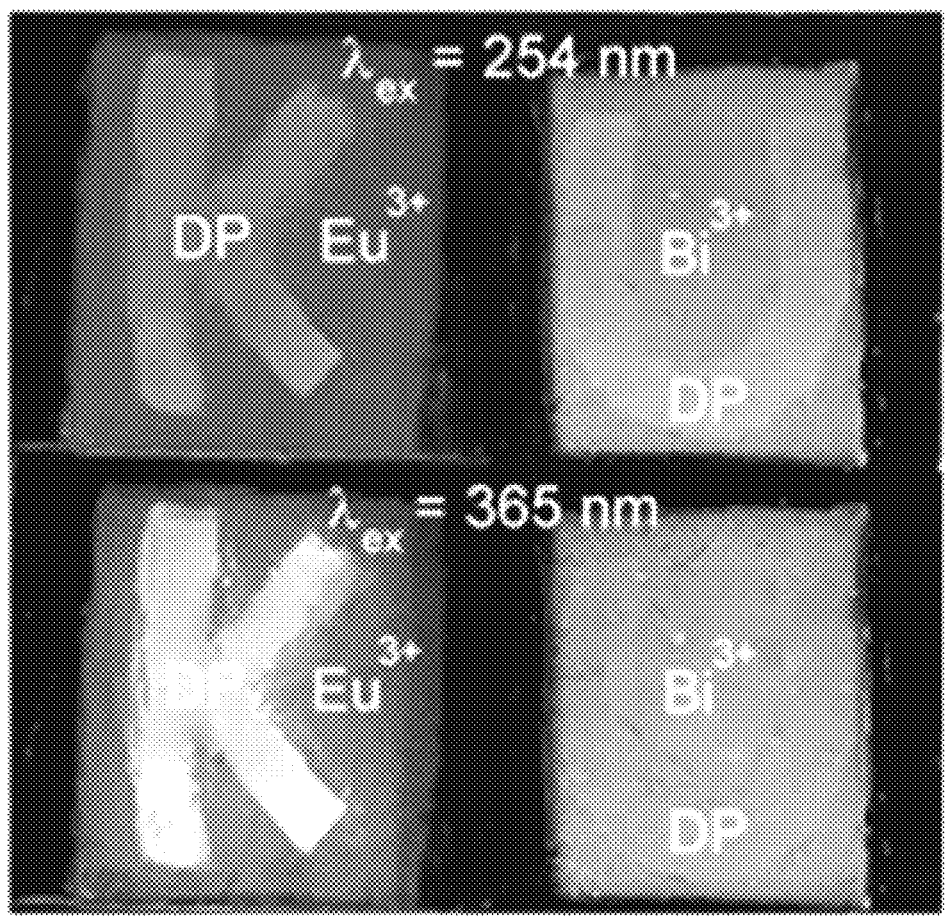

Referring to FIG. 10A, the shape of the nano-pattern of bismuth-doped yttrium vanadium oxide doped and europium-doped yttrium vanadium oxide doubled-printed may be confirmed. Referring to FIG. 10B, it may be confirmed that light emission spectra of two materials are simultaneously detected in the case of the double print. Referring to FIG. 10C, it may be seen that the mixed colors of the two materials are emitted in the case of the double print. Referring to FIGS. 10D and 10E, it may be confirmed that attenuation characteristics of the two materials are simultaneously detected. That is, it may be confirmed that the double print has both luminescence characteristics of europium and bismuth, and thus, red and green are mixed to emit an orange light.

FIG. 11 is photographs, graphs and a diagram illustrating multi-color visible light conversion depending on an ultraviolet excitation wavelength of a double print according to an embodiment of the inventive concept. FIG. 11A is emission photographic images of a bismuth-doped yttrium vanadium oxide and europium-doped yttrium vanadium oxide double print under 254 nm and 365 nm ultraviolet lamp irradiation. FIG. 11B is a light emission spectrum upon UV excitation of 250 to 340 nm of a bismuth-doped yttrium vanadium oxide and europium-doped yttrium vanadium oxide double print. FIG. 11C is relative emission intensities depending on excitation wavelengths of 617 nm emission of europium ion and 540 nm emission of bismuth ion. FIG. 11D is a CIE chromaticity diagram of a single print (when the second structure and the third structure are not provided) and a double print based on an excitation wavelength. FIG. 11E illustrates emission photographs under 254 nm and 365 nm UV lamp irradiation of 'KU' character printing through a europium-doped yttrium vanadium oxide single print, a europium-doped yttrium vanadium oxide single print, and a double print of the two materials. Referring to FIG. 11, it may be confirmed that the emission color of the double print is adjusted depending on the ultraviolet excitation wavelength through the light emission spectrum, CIE chromaticity diagram, and visual checking of the emission color under the UV lamp irradiation. In particular, referring to FIG. 11, it may be confirmed that the double print and single print are applied to secure character whose color changes depending on the wavelength of ultraviolet light.

FIG. 12 is photographs, graphs and a diagram illustrating multi-color visible light conversion depending on an ultraviolet excitation wavelength of a triple print according to an embodiment of the inventive concept. FIG. 12A is a scanning electron microscope low magnification image of a erbium-doped yttrium vanadium oxide, bismuth-doped yttrium oxide, and europium-doped yttrium oxide triple print. FIG. 12B is a scanning electron microscope medium magnification image of a erbium-doped yttrium vanadium oxide, bismuth-doped yttrium oxide, and europium-doped yttrium oxide triple print. FIG. 12C is absorption spectra of a erbium-doped yttrium vanadium oxide single print, a bismuth-doped yttrium oxide single print, and a europium-doped yttrium oxide single print. FIG. 12D illustrates emission photographs upon UV lamp irradiation with 254 nm, 312 nm, and 365 nm of a erbium-doped yttrium vanadium oxide, bismuth-doped yttrium oxide, and europium-doped yttrium oxide triple print, respectively. FIG. 12E illustrates light emission spectra during ultraviolet excitation of 250 to 370 nm of a erbium-doped yttrium vanadium oxide, bismuth-doped yttrium oxide, and europium-doped yttrium oxide triple print. FIG. 12F is a CIE chromaticity diagram of light emission spectra during UV excitation of 250 to 370 nm of a erbium-doped yttrium vanadium oxide, bismuth-doped yttrium oxide, and europium-doped yttrium oxide triple print.

A process for manufacturing the $YVO_4:Er^{3+}/Y_2O_3:Bi^{3+}/Y_2O_3:Eu^{3+}$ triple print illustrated in FIGS. 12A and 12B will be described as follows. $Y(NO_3)_3 \cdot 6H_2O$ (1.689 g, 4.410 mmol), citric acid (1.729 g, 9.0 mmol), $VO(acac)_2$ (1.193 g, 4.5 mmol) were mixed with 2-methoxyethanol (3 mL) to synthesize $YVO_4:Er^{3+}$ solution. Then, $Er(NO_3)_3 \cdot 5H_2O$ (40 mg, 90 µmol) was mixed with the solution for doping and the mixed solution was magnetically stirred in a capped vial at 90° C. for 1 hour until it became a clear solution.

$Y(NO_3)_3 \cdot 6H_2O$ (3.562 g, 9.3 mmol) was mixed with 2-methoxyethanol (1 mL) and acetic acid (1 mL) to synthesize $Y_2O_3:Eu^{3+}$ solution. $Eu(NO_3)_3 \cdot 6H_2O$ (312 mg, 700 µmol) was mixed the above solution for doping. The mixed solution was magnetically stirred in a capped vial at 90° C. for 1 hour until it became a clear solution.

$Y(NO_3)_3 \cdot 6H_2O$ (3.754 g, 9.8 mmol) was mixed with 2-methoxyethanol (1 mL) and acetic acid (1 mL) to synthesize $Y_2O_3:Bi^{3+}$. $Bi(NO_3)_3 \cdot 4H_2O$ (93 mg, 200 µmol) was mixed with the above solution for doping. The mixed solution was magnetically stirred in a capped vial at 90° C. for 1 hour until it became a clear solution.

$YVO_4:Er^{3+}$, $Y_2O_3:Bi^{3+}$, $Y_2O_3:Eu^{3+}$ were sequentially patterned using three synthesized solutions. The continuous patterning process was performed in the same manner as the process of in FIG. 10. The rotation angle between the second pattern ($Y_2O_3:Bi^{3+}$ pattern) and the third pattern ($Y_2O_3:Eu^{3+}$ pattern) was π/9, and the heat treatment temperatures of the three materials were 1000° C., 800° C., and 800° C., respectively.

Figure 12A:
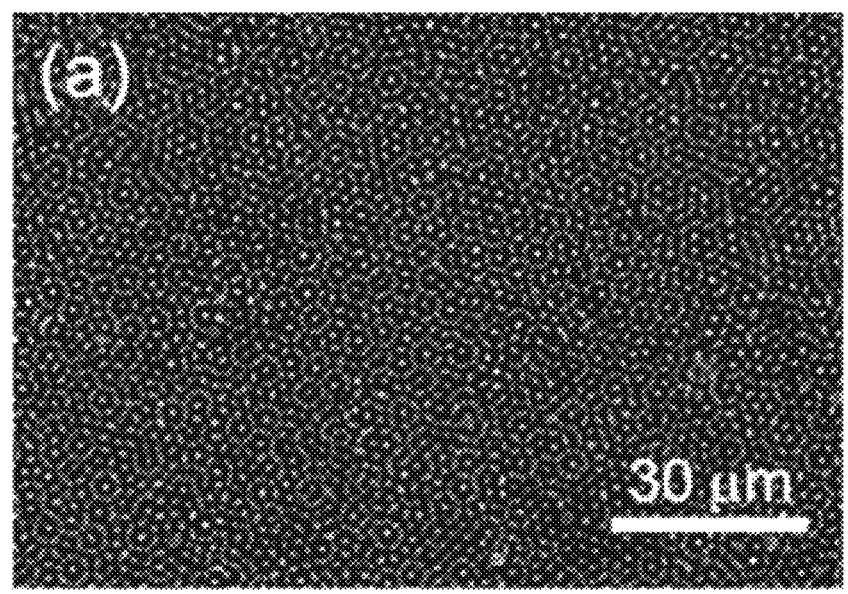
FIG. 12A-FIG. 12F are photographs, graphs and a diagram illustrating multi-color visible light conversion depending on an ultraviolet excitation wavelength of a triple print according to an embodiment of the inventive concept.
Figure 12B:
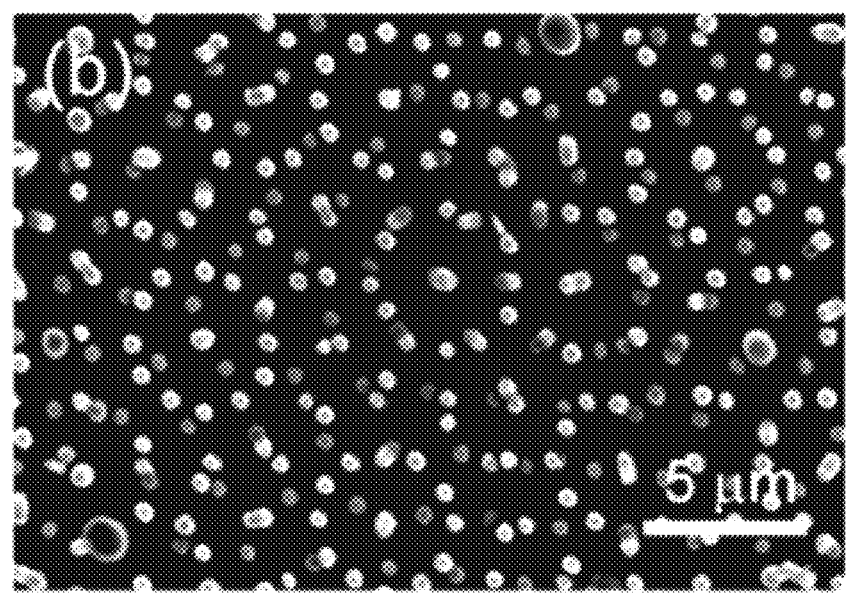
Figure 12C:
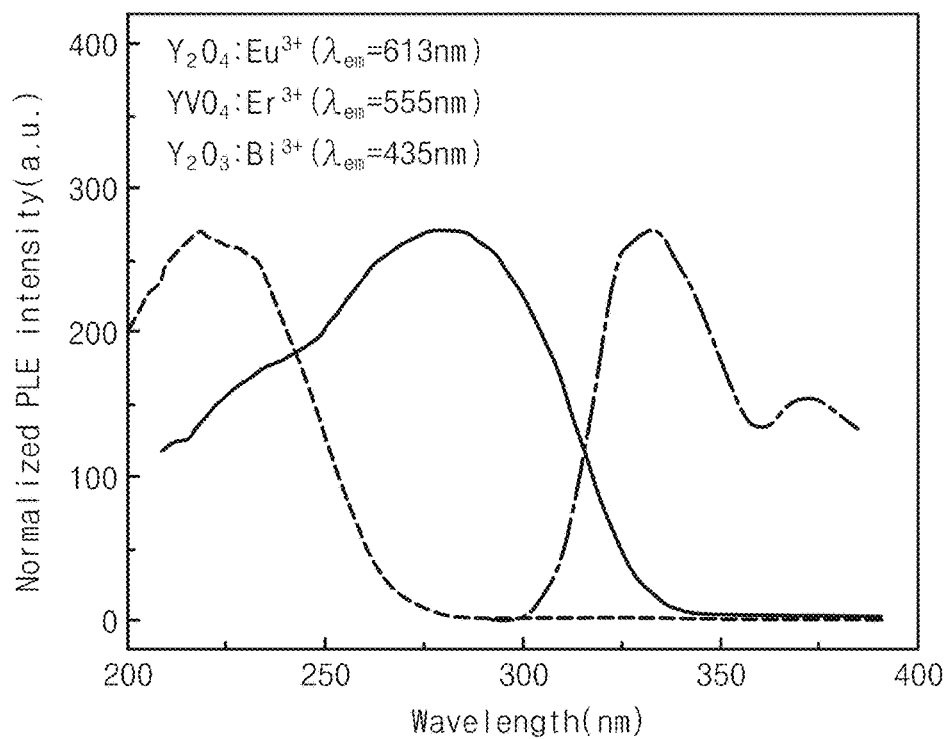
Figure 12D:
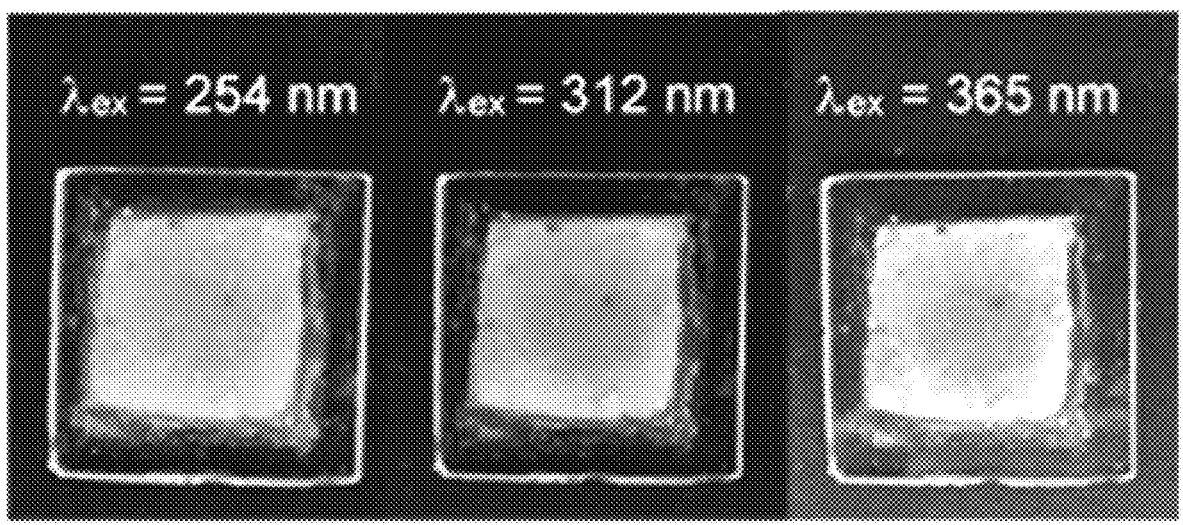
Figure 12E:
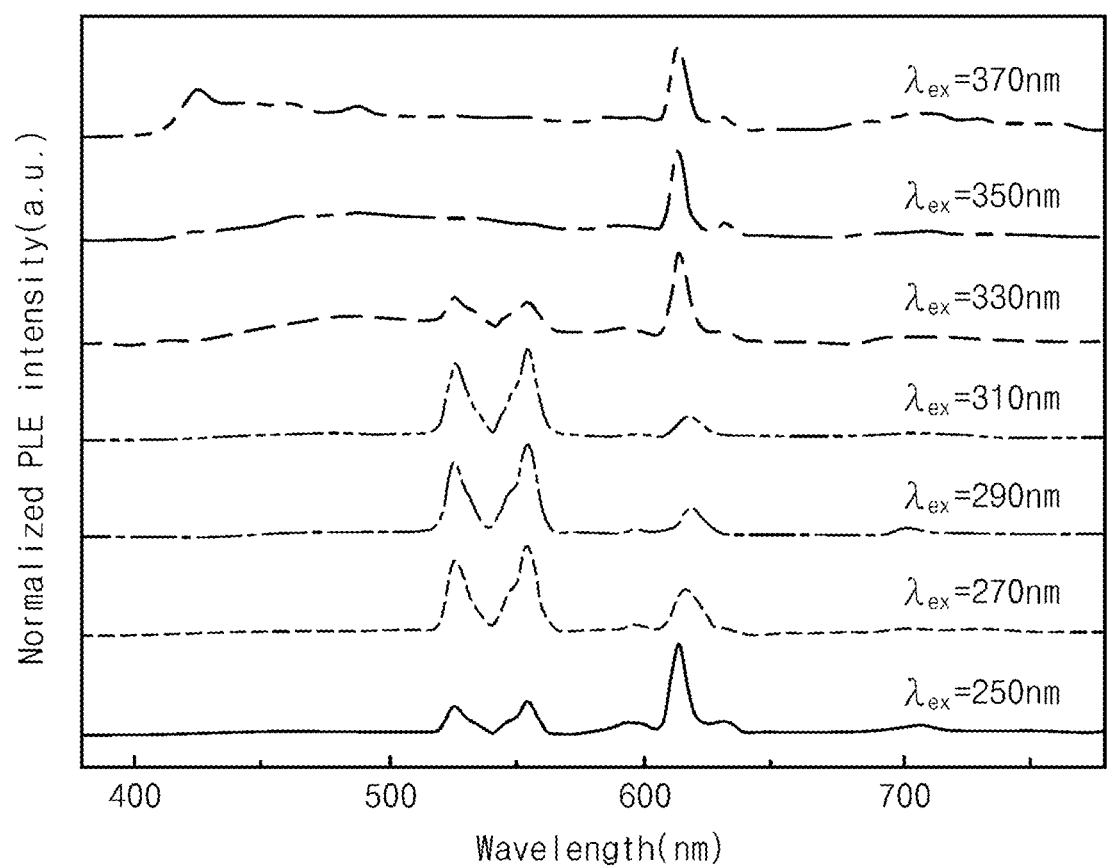
Figure 12F:
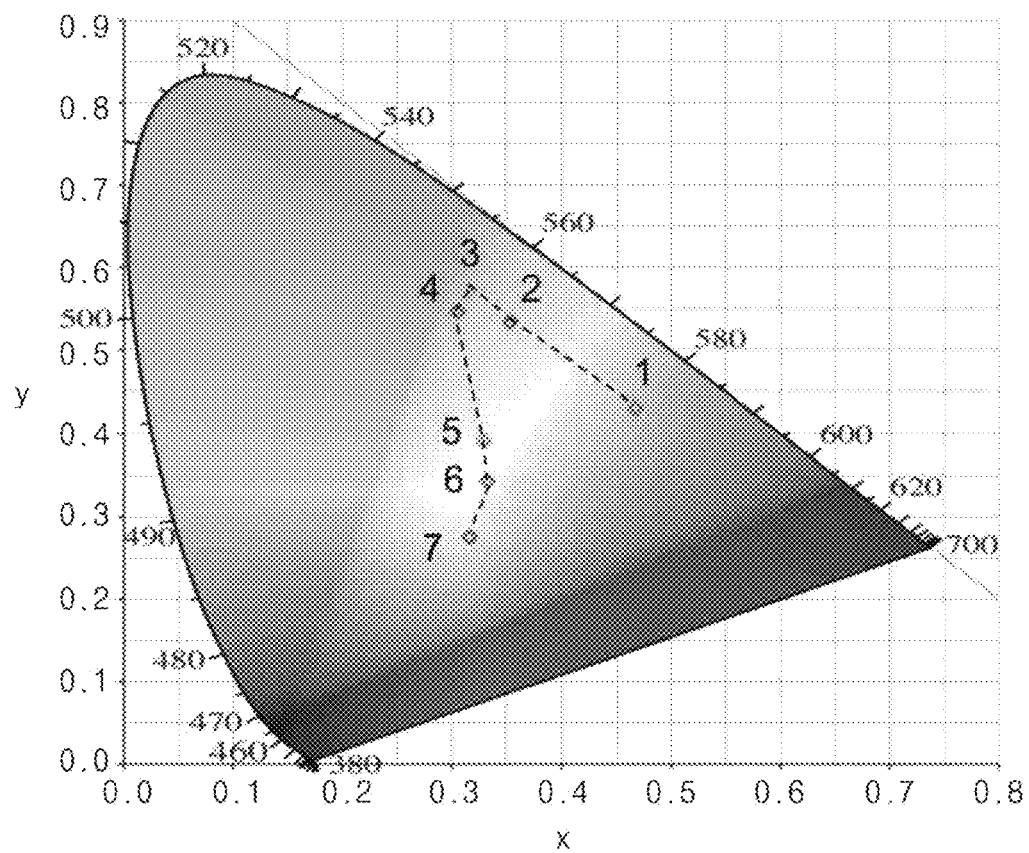

Referring to FIGS. 12A and 12B, the shape of the triple print may be confirmed. Referring to FIG. 12C, it may be seen that the three materials provided absorb ultraviolet lights in different wavelength regions. Referring to FIG. 12D, it may be visually confirmed that the triple print generates visible lights of different colors depending on the wavelength of the incident ultraviolet light. Referring to FIGS. 12E and 12F, it may be seen that the spectral shape changes depending on the ultraviolet light in the range of 250 to 370 nm. Referring to FIG. 12, it may be confirmed that the emission color of the triple print is adjusted depending on the ultraviolet excitation wavelength through the light emission spectrum, CIE chromaticity diagram, and visual checking of the emission color under ultraviolet lamp irradiation.

Figure 13A:
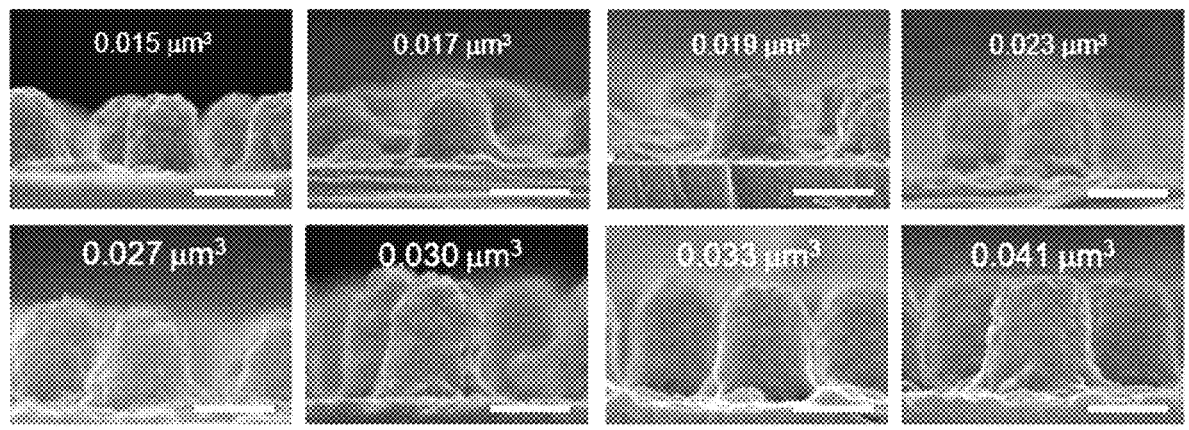
FIG. 13A-FIG. 13C illustrate SEM images (FIG. 13A), a transmittance spectrum (FIG. 13B) and a graph between a volume and a Mie resonance wavelength (FIG. 13C) of various volumes of YVO$_4$:Er$^{3+}$ nano-patterns.
Figure 13B:
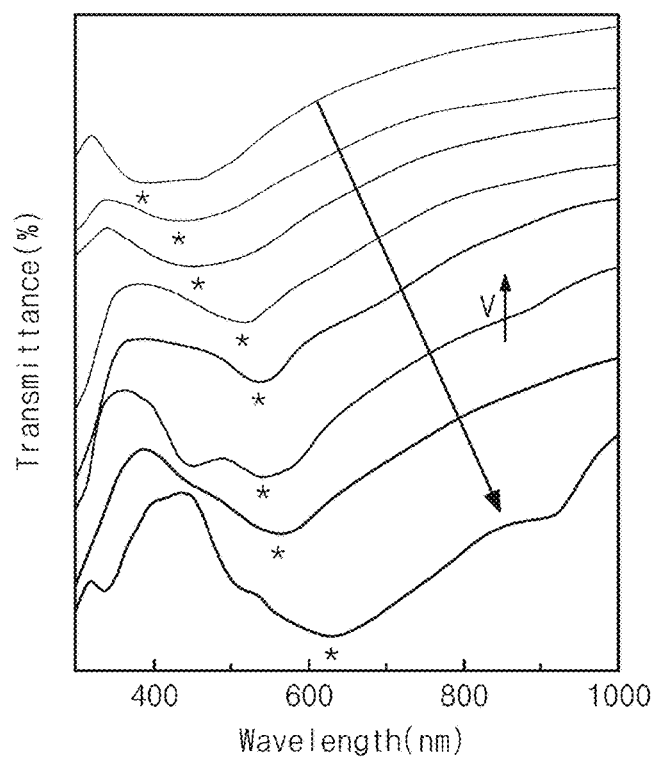
Figure 13C:
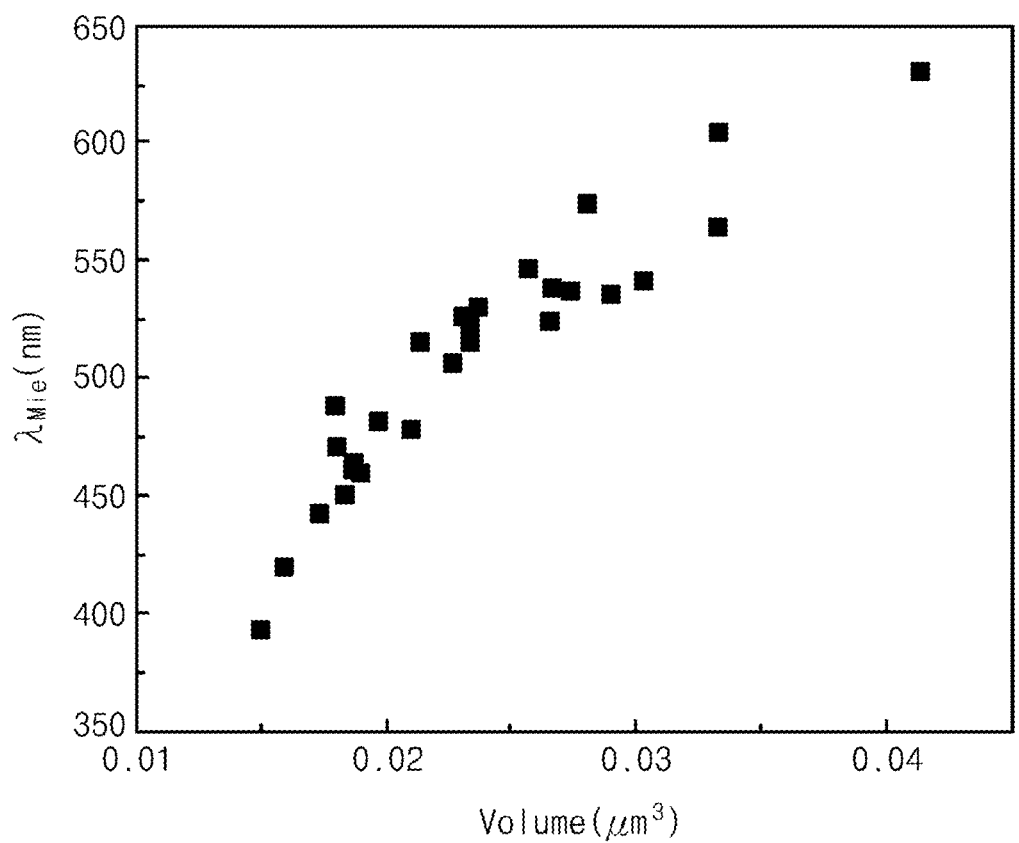

FIG. 13 illustrates SEM images (FIG. 13A), a transmittance spectrum (FIG. 13B) and a graph between a volume and a Mie resonance wavelength (FIG. 13C) of various volumes of $YVO_4:Er^{3+}$ nano-patterns. A scale bar on FIG. 13A represents 300 nm. Referring to FIG. 13B, the above data illustrates that the Mie resonance wavelength changes depending on the size of the nano-pattern. It may be seen that the Mie resonance wavelength (asterisk) on transmittance spectra increases as volumes of eight nano-patterns increase. Referring to FIG. 13C, it may be seen that a relationship between the volume of the nano-pattern and the Mie resonance wavelength is generally proportional.

Figure 14A:
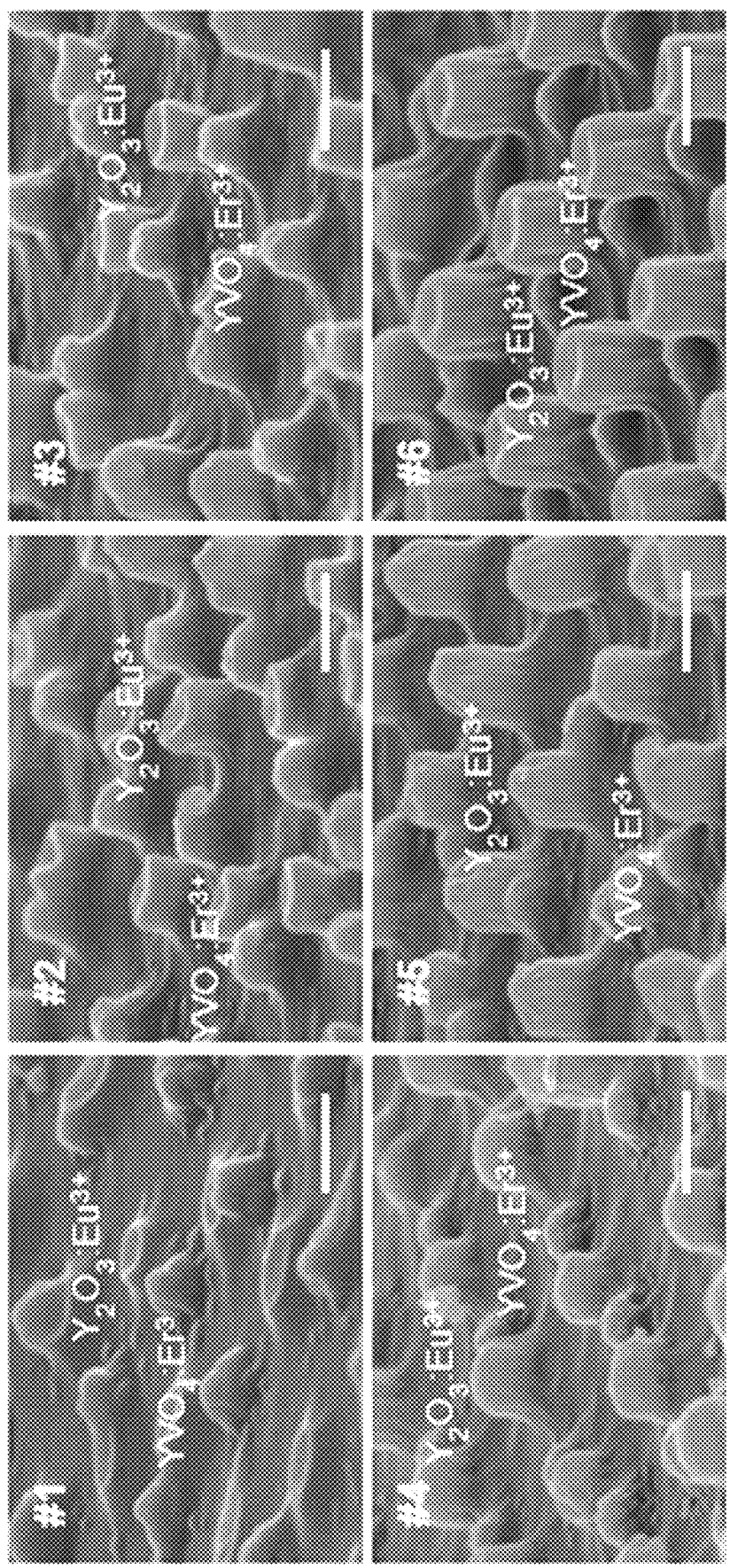
FIG. 14A-FIG. 14E are SEM images (FIG. 14A) of YVO$_4$:Er$^{3+}$/Y$_2$O$_3$:Eu$^{3+}$ double prints that change a size of the Y$_2$O$_3$:Eu$^{3+}$ nano-pattern, luminescence photographs (FIG. 14B) upon irradiation with 254 nm UV lamp, luminescence photographs (FIG. 14C) upon irradiation with 312 nm UV lamp, and a PL spectrum (FIG. 14D) and a CIE color coordinate (FIG. 14E) at 254 nm excitation.
Figure 14B:
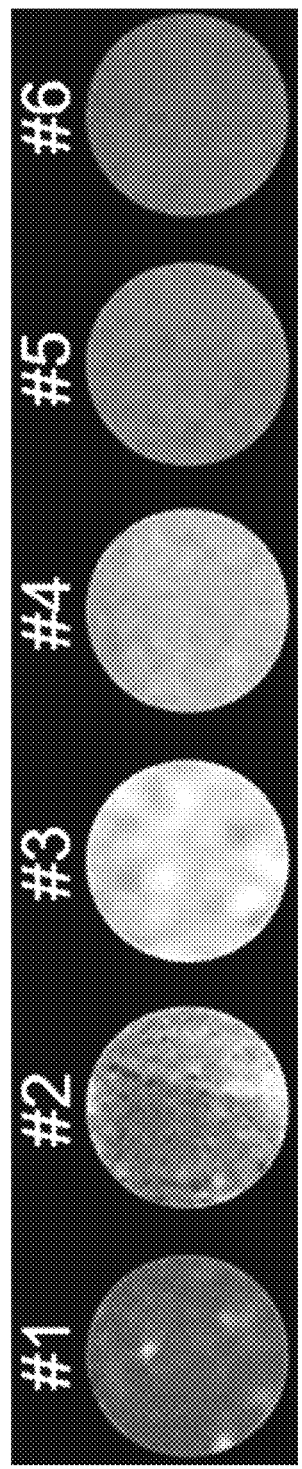
Figure 14C:
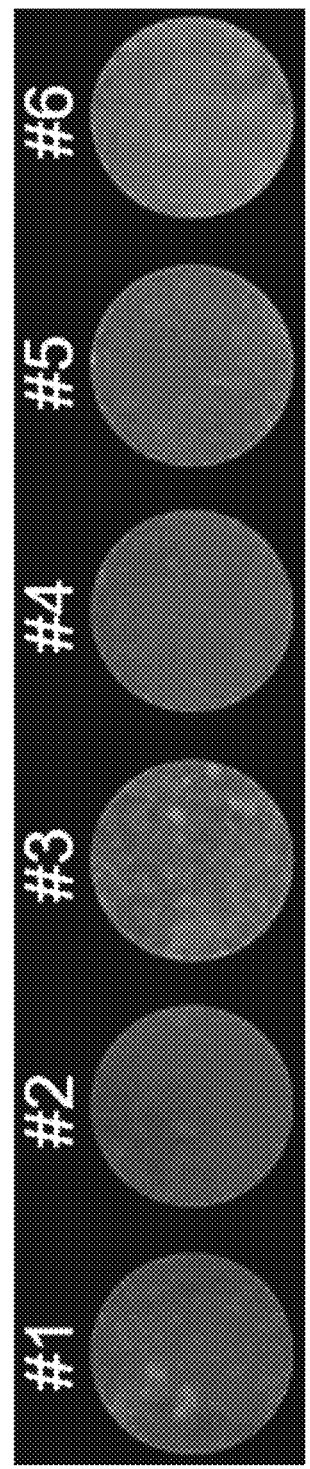
Figure 14D:
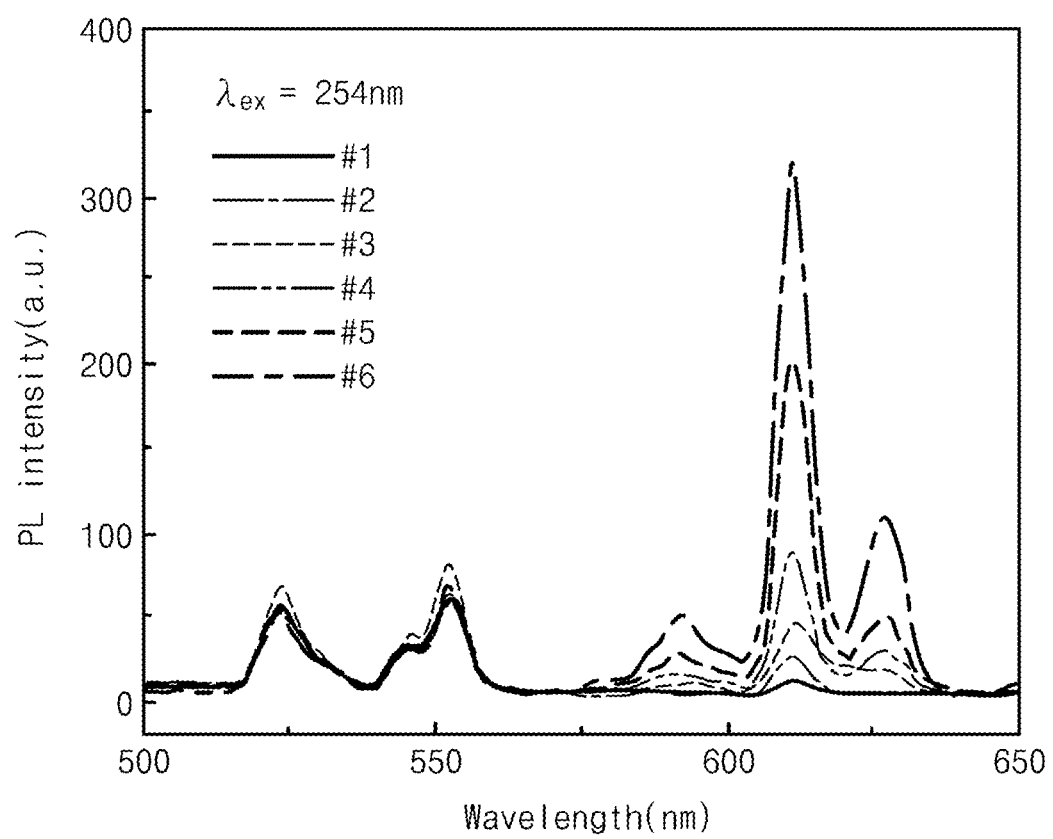
Figure 14E:
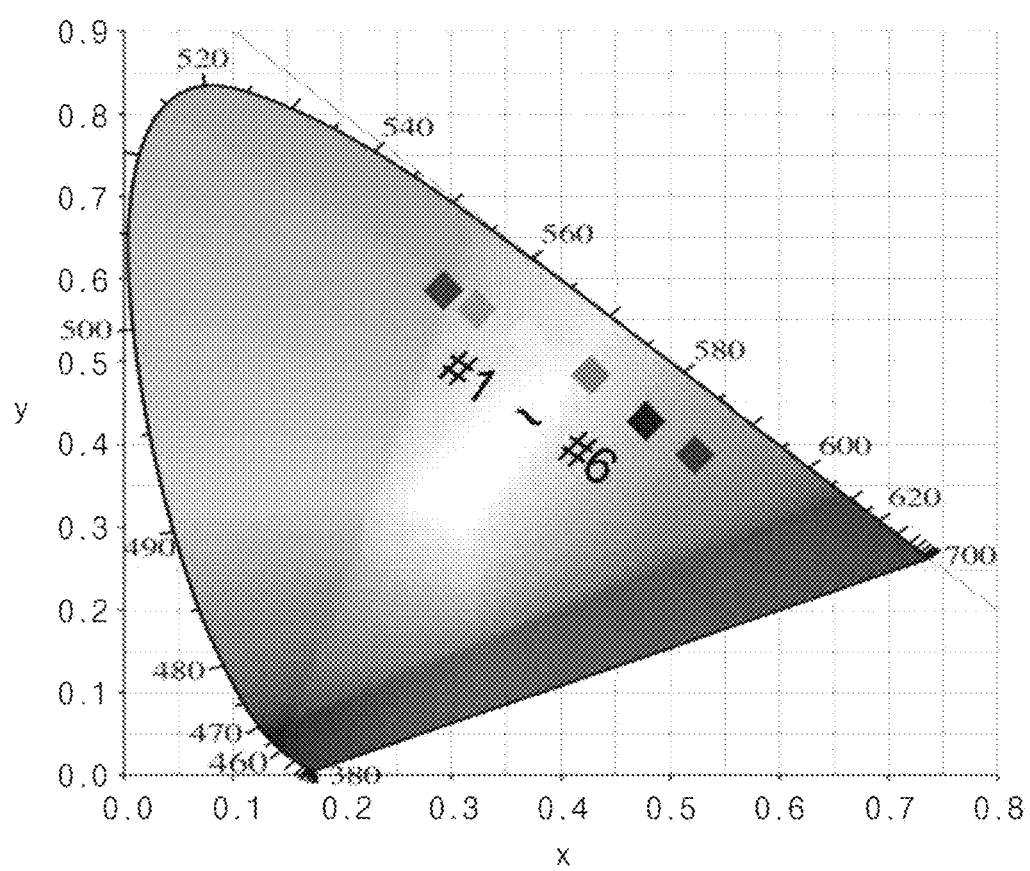
Figure 15A:
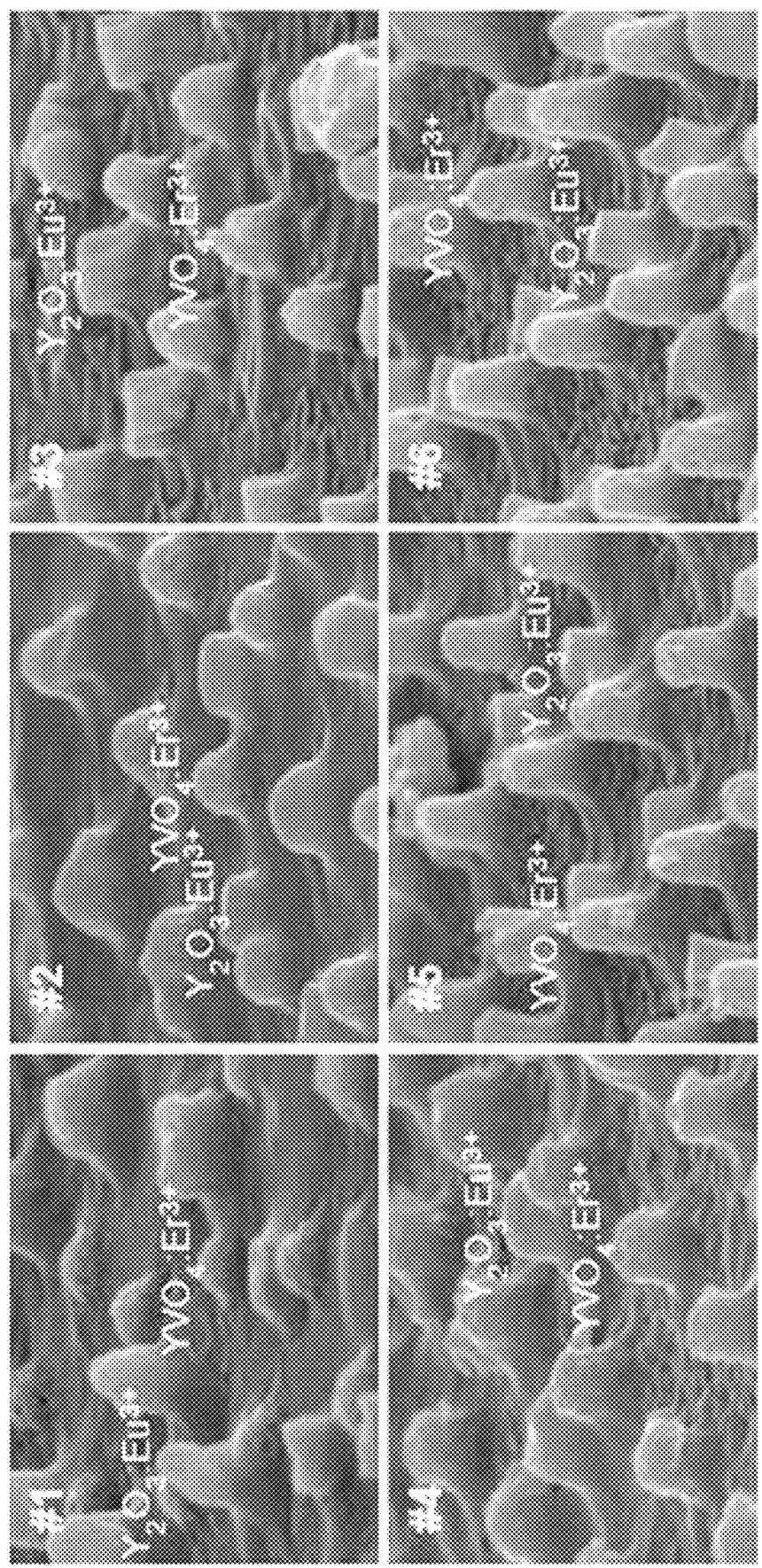
FIG. 15A-FIG. 15E are SEM images (FIG. 15A) of YVO$_4$:Er$^{3+}$/Y$_2$O$_3$:Eu$^{3+}$ double prints that change a size of the YVO$_4$:Er$^{3+}$ nano-pattern, luminescence photographs (FIG. 15B) upon irradiation with 254 nm UV lamp, luminescence photographs (FIG. 15C) upon irradiation with 312 nm UV lamp, and a PL spectrum (FIG. 15D) and a CIE color coordinate (FIG. 15E) at 254 nm excitation.
Figure 15B:
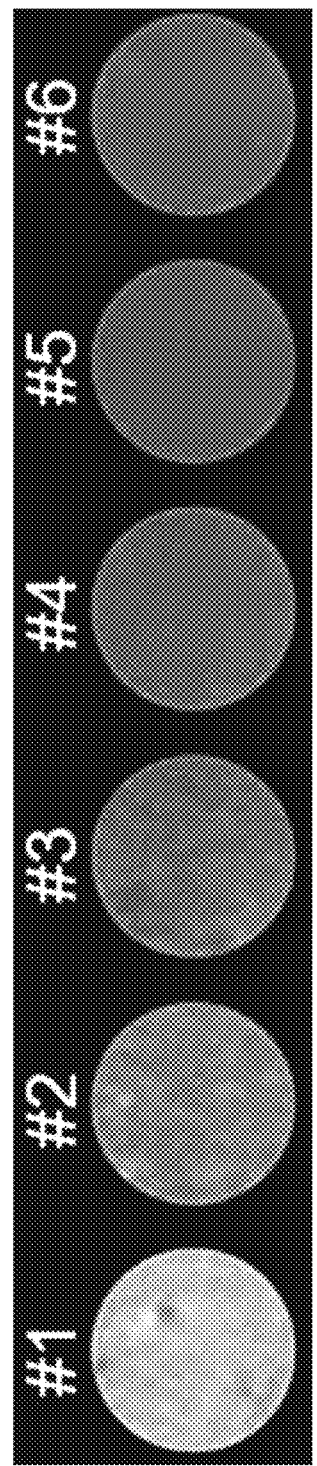
Figure 15C:
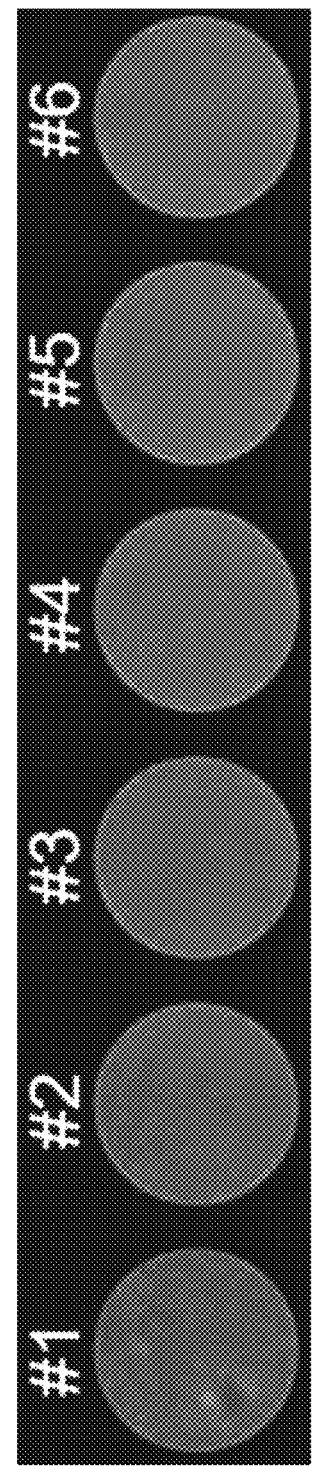
Figure 15D:
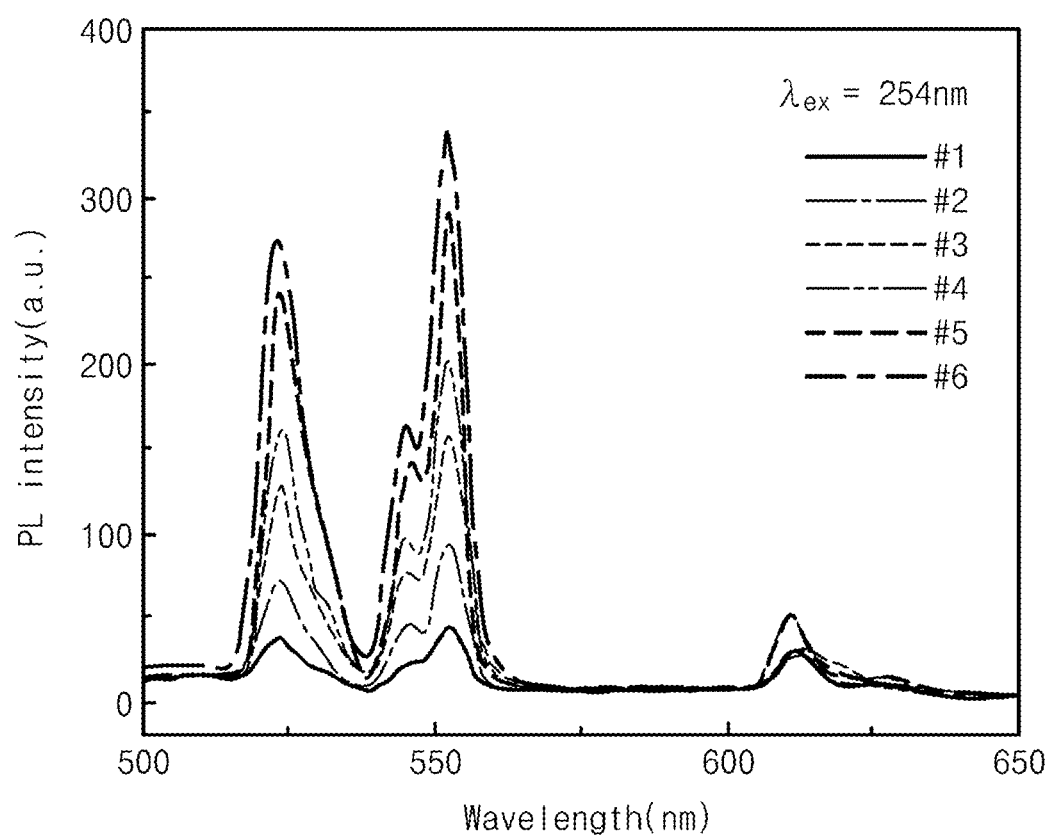
Figure 15E:
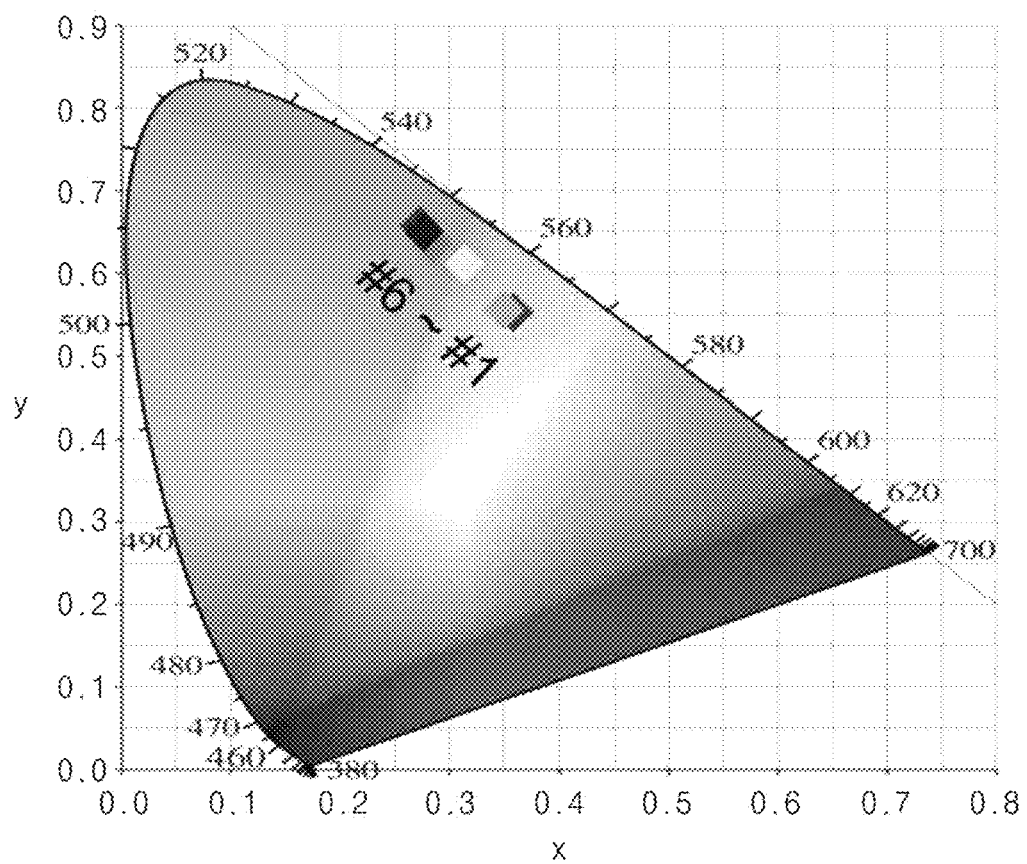

Accordingly, it may be confirmed that the size of the nano-pattern is adjusted to adjust the Mie resonance wavelength. FIG. 14 is SEM images (FIG. 14A) of $YVO_4:Er^{3+}/Y_2O_3:Eu^{3+}$ double prints that change a size of the $Y_2O_3:Eu^{3+}$ nano-pattern, luminescence photographs (FIG. 14B) upon irradiation with 254 nm UV lamp, luminescence photographs (FIG. 14C) upon irradiation with 312 nm UV lamp, and a PL spectrum (FIG. 14D) and a CIE color coordinate (FIG. 14E) at 254 nm excitation. As described above, when two materials of the first structure 100, the second structure 200, and the third structure 300 are nano-patterned (double-printed) at the same time, multi-color light emission based on the wavelength of the incident ultraviolet light is capable of being implemented. Referring to FIG. 14, as the size of each material nano-pattern constituting the double print is adjusted, the emission color may be adjusted. Thus, a double print having the most optimized nano-pattern size may be produced. Referring to FIG. 14A, $YVO_4:Er^{3+}/Y_2O_3:Eu^{3+}$ double prints were prepared in which the size of the $Y_2O_3:Eu^{3+}$ nano-pattern was changed to observe the change in emission color depending on the size of the nano-pattern. From Sample #1 to #6, it may be seen that the size of the $YVO_4:Er^{3+}$ nano-pattern remains constant and the size of the $Y_2O_3:Eu^{3+}$ nano-pattern increases. Referring to FIG. 14B, it may be seen that the red light emission of $Y_2O_3:Eu^3$ becomes stronger as samples are irradiated from Sample #1 to #6 when the 254 nm ultraviolet lamp is irradiated. Referring to FIG. 14D, it may be confirmed that as the samples are moved from Sample #1 to #6 on the PL spectrum, the 611 nm peak intensity of $Y_2O_3:Eu^3$ increases gradually. Referring to FIG. 14E, when FIG. 14D is converted into the CIE color coordinate, as the size of the $Y_2O_3:Eu^{3+}$ nano-pattern increases, it is observed that the coordinate gradually moves to the color of the red region. An increase of the intensity of red emission as the size of the $Y_2O_3:Eu^{3+}$ nano-pattern increases is because that the Mie resonance wavelength becomes closer to the $Y_2O_3:Eu^{3+}$ emission wavelength to increase the luminance efficiency, which is not an increase in luminescence intensity due to a simple increase in volume. Referring to FIG. 14C, it is seen that green light is emitted regardless of the size of the $Y_2O_3:Eu^{3+}$ nano-pattern upon 312 nm ultraviolet irradiation. This is because only $YVO_4:Er^{3+}$ absorbs light in the corresponding ultraviolet region. To sum up, Sample #6 among samples is the most optimized sample because the light emission color range depending on the incident wavelength is the widest.

FIG. 15 is SEM images (FIG. 15A) of $YVO_4:Er^{3+}/Y_2O_3:Eu^{3+}$ double prints that change a size of the $YVO_4:Er^{3+}$ nano-pattern, luminescence photographs (FIG. 15B) upon irradiation with 254 nm UV lamp, luminescence photographs (FIG. 15C) upon irradiation with 312 nm UV lamp, and a PL spectrum (FIG. 15D) and a CIE color coordinate (FIG. 15E) at 254 nm excitation. Referring to FIG. 15A, unlike FIG. 14, $YVO_4:Er^{3+}/Y_2O_3:Eu^{3+}$ double prints in which the size of the $YVO_4:Er^{3+}$ nano-pattern was changed were produced. It may be seen that the size of the $Y_2O_3:Eu^{3+}$ nano-pattern remains constant and the size of the $YVO_4:Er^{3+}$ nano-pattern increases from Sample #1 to #6. Referring to FIG. 15B, it may be seen that the green emission of $YVO_4:Er^{3+}$ becomes stronger from Sample #1 to #6 upon 254 nm ultraviolet lamp irradiation. Referring to FIG. 15D, it may be seen that the intensity of the 554 and 524 nm peaks of $YVO_4:Er^{3+}$ increases gradually from Sample #1 to #6 on the PL spectrum. Referring to FIG. 15E, when FIG. 15D is converted into the CIE color coordinate, as the size of the YVO$_4$:Er$^{3+}$ nano-pattern increases, it is observed that the coordinate gradually moves to the color of the green region. An increase of the intensity of green emission as the size of the YVO$_4$:Er$^{3+}$ nano-pattern increases is because that the Mie resonance wavelength becomes closer to the YVO$_4$:Er$^{3+}$ emission wavelength to increase the luminance efficiency, which is not an increase in luminescence intensity due to a simple increase in volume. Referring to FIG. 15C, it is observed that all samples only emit green light when irradiating with 312 nm ultraviolet light. This is because only YVO$_4$:Er$^{3+}$ absorbs light in the corresponding ultraviolet region. To sum up, Sample #1 among samples is the most optimized sample because the light emission color range depending on the incident wavelength is the widest.

Summing up the results of FIGS. 13 to 15, it may be confirmed that the Mie resonance wavelength is adjusted depending on the size of the nano-pattern and the resonance wavelength is adjusted to adjust the emission intensity. By using this, the size of the nano-patterns in the double print may be adjusted to manufacture the optimized device capable of implementing multi-color emission in the widest area depending on the incident ultraviolet wavelength. Also, this may be applied to the triple print in the same way. Therefore, the down-converted light emitting combination 10 according to the embodiment of the inventive concept may adjust the size of the nano-pattern of the first structure 100 and the second structure 200, or the first structure 100, the second structure 200, and the third structure 300, respectively, to adjust the range of the color of visible light generated.

As described above, in the down-converted light emitting combination 10 of the inventive concept, when the ultraviolet light is incident, the two or three structures that emit the visible lights of the different colors at different intensities depending on the wavelength of the ultraviolet light are provided as the nano-patterns. Therefore, the absorption of light and the luminance efficiency are increased by the Mie resonance phenomenon between the light and the material due to the nano-pattern, and as a result, the luminescence intensity and luminescence quality are improved. In addition, the down-converted light emitting combination 10 of the inventive concept may improve the luminance efficiency of the thin film through the nano-pattern to improve its performance when applying a device, and may generate the visible lights of the different colors depending on the wavelength of the incident ultraviolet light to allow the wavelength of ultraviolet light to be easily seen with the naked eye. When applied to an ultraviolet imaging system such as an ultraviolet camera, it may be applied to various fields such as implementing multi-color imaging depending on the wavelength and reducing manufacturing cost.

In particular, the down-converted light emitting combination 10 of the inventive concept may convert the unnecessary ultraviolet light into the visible light required for a solar cell, thereby improving efficiency of the solar cell. In addition, the down-converted light emitting combination 10 of the inventive concept may convert the unnecessary ultraviolet light into wavelengths of light required for a photocatalyst thereby improving efficiency of the photocatalyst.

The down-converted light emitting combination according to an embodiment of the inventive concept may improve the luminance intensity, luminance efficiency, luminance quality, and application range.

In addition, the down-converted light emitting combination according to an embodiment of the inventive concept may generate the visible lights of the different colors depending on the wavelength of the incident ultraviolet light.

The above description is illustrative of the inventive concept. Also, the above disclosure is intended to illustrate and explain the preferred embodiments of the inventive concept, and the inventive concept may be used in various other combinations, modifications, and environments. In other words, the inventive concept may be changed or modified within the scope of the concept of the invention disclosed herein, within the equivalent scope of the disclosure, and/or within the skill and knowledge of the art. The described embodiments illustrate the best state of the art to implement the technical idea of the inventive concept, and various changes may be made thereto as being demanded for specific applications and uses of the inventive concept. Accordingly, the above description is not intended to limit the inventive concept to the embodiments. Also, the appended claims should be construed as encompassing such other embodiments.

What is claimed is:

1. A down-converted light emitting combination comprising:
   a first structure made of a first material configured to generate a visible light of a first color when an ultraviolet light of a first wavelength range is incident; and
   a second structure made of a second material configured to generate a visible light of a second color different from the first color when an ultraviolet light of a second wavelength range different from the first wavelength range is incident,
   wherein the first material and the second material are materials which generate visible lights of different wavelength ranges and different distributions of intensities depending on a wavelength of an incident ultraviolet light.

2. The down-converted light emitting combination of claim 1, further comprising:
   a substrate for supporting the first structure and the second structure,
   wherein the first structure and the second structure are formed in a nano-pattern on the substrate, respectively.

3. The down-converted light emitting combination of claim 1, wherein the first material and the second material are provided with yttrium vanadium oxide (YVO$_4$) or yttrium oxide (Y$_2$O$_3$) in which lanthanide ions are doped to have down-converted light emission characteristics that generates the visible light when the ultraviolet light is incident.

4. The down-converted light emitting combination of claim 3, wherein the lanthanide ions are provided with europium ion (Eu$^{3+}$), bismuth ion (Bi$^{3+}$), or erbium ion (Er$^{3+}$).

5. The down-converted light emitting combination of claim 1, further comprising:
   a third structure made of a third material configured to generate a visible light of a third color different from the first color and the second color when the ultraviolet light of third wavelength range different from the first wavelength range and the second wavelength range is incident,
   wherein the first material, the second material, and the third material are materials which generate visible lights of different wavelength ranges and different distributions of intensities depending on a wavelength of the incident ultraviolet light.

6. The down-converted light emitting combination of claim 5, further comprising:

a substrate for supporting the first structure, the second structure, and the third structure, wherein the first structure, the second structure, and the third structure are formed in a nano-pattern on the substrate, respectively.

7. The down-converted light emitting combination of claim 5, wherein the first material, the second material, and the third material are provided with yttrium vanadium oxide ($YVO_4$) or yttrium oxide ($Y_2O_3$) in which lanthanide ions are doped to have down-converted light emission characteristics that generates the visible light when the ultraviolet light is incident.

8. The down-converted light emitting combination of claim 5, wherein the first color, the second color, and the third color are one of red, green, and blue colors, respectively.

9. The down-converted light emitting combination of claim 2, wherein a range of the color of the visible light generated is controllable by adjusting a size of the nano-pattern of each structure.

10. A method of manufacturing a down-converted light emitting combination configured to generate a visible light when an ultraviolet light is incident, the method comprising:

forming a first structure made of a first material configured to generate a visible light of a first color when an ultraviolet light of first wavelength range is incident on a substrate; and forming a second structure made of a second material configured to generate a visible light of a second color different from the first color when the ultraviolet light of second wavelength range different from the first wavelength range is incident on the substrate on which the first structure is formed.

11. The method of claim 10, wherein the forming of the first structure includes:

first coating a first solution in which components constituting the first material are dissolved on the substrate;

seating a first PDMS mold on the substrate to which the first solution is applied; and evaporating a first solvent of the first solution applied on the substrate.

12. The method of claim 11, wherein the forming of the first structure further includes:

removing the first PDMS mold from the substrate after the evaporating of the first solvent; and first heating the substrate.

13. The method of claim 11, further comprising:

preparing the first solution, wherein, in the preparing of the first solution, Y$(NO_3)_3.6H_2O$ and citric acid and Eu$(NO_3)_3.6H_2O$, Bi$(NO_3)_3.4H_2O$ or Er$(NO_3)_3.5H_2O$ are mixed with a 2-methoxyethanol solvent to prepare the first solution.

14. The method of claim 13, wherein in the preparing of the first solution, VO(acac)$_2$ is further mixed with the 2-methoxyethanol solvent to prepare the first solution.

15. The method of claim 10, wherein the forming of the second structure includes:

second coating a second solution in which components constituting the second material are dissolved on the substrate on which the first structure is formed;

seating a second PDMS mold on the substrate to which the second solution is applied; and evaporating a second solvent of the second solution applied on the substrate.

16. The method of claim 15, wherein the forming of the second structure further includes:

removing the second PDMS mold from the substrate after the evaporating of the second solvent; and second heating the substrate.

17. The method of claim 15, wherein further comprising:

preparing the second solution, wherein, in the preparing of the second solution, Y$(NO_3)_3.6H_2O$ and citric acid and, Eu$(NO_3)_3.6H_2O$, Bi$(NO_3)_3.4H_2O$, or Er$(NO_3)_3.5H_2O$ are mixed to a 2-methoxyethanol solvent to prepare the second solution.

18. The method of claim 17, wherein, in the preparing of the second solution, VO(acac)$_2$ is further mixed with the 2-methoxyethanol solvent to prepare the second solution.

19. The method of claim 15, wherein, in the seating of the second PDMS mold, the PDMS mold is rotated at a predetermined angle with respect to the PDMS mold seated in the seating of the first PDMS mold to be seated on the substrate coated with the second solution.

20. The method of claim 10, further comprising:

forming a third structure formed on the substrate on which the first structure and the second structure are formed, and made of a third material that generates a visible light of a third color different from the first color and the second color when the ultraviolet light is incident.

* * * * *